(12) United States Patent
Hassan et al.

(10) Patent No.: US 11,656,297 B2
(45) Date of Patent: May 23, 2023

(54) POWER ELECTRONIC INSTRUMENT FOR CONTINUOUSLY MONITORING STABILITY AND STABILIZING A DC MICROGRID

(71) Applicants: Rohail Hassan, Logan, UT (US); Hongjie Wang, North Logan, UT (US); Regan A. Zane, Hyde Park, UT (US)

(72) Inventors: Rohail Hassan, Logan, UT (US); Hongjie Wang, North Logan, UT (US); Regan A. Zane, Hyde Park, UT (US)

(73) Assignee: Utah State University, Logan, UT (US)

( * ) Notice: Subject to any disclaimer, the term of this patent is extended or adjusted under 35 U.S.C. 154(b) by 316 days.

(21) Appl. No.: 17/204,791

(22) Filed: Mar. 17, 2021

(65) Prior Publication Data

US 2021/0293893 A1 Sep. 23, 2021

Related U.S. Application Data

(60) Provisional application No. 62/990,770, filed on Mar. 17, 2020.

(51) Int. Cl.
*G01R 31/40* (2020.01)
*G05B 19/042* (2006.01)
*H02J 1/00* (2006.01)

(52) U.S. Cl.
CPC ......... *G01R 31/40* (2013.01); *G05B 19/0428* (2013.01); *H02J 1/00* (2013.01); *G05B 2219/2639* (2013.01)

(58) Field of Classification Search
CPC ............. G01R 31/40; G05B 19/0428; G05B 2219/2639; H02J 1/00; H02J 1/102; H02J 1/14; H02J 1/084; Y02T 50/50
See application file for complete search history.

(56) References Cited

U.S. PATENT DOCUMENTS

| | | | | |
|---|---|---|---|---|
| 9,513,342 | B1* | 12/2016 | Salmani | G01R 27/00 |
| 2014/0122050 | A1* | 5/2014 | Fu | B60L 1/00 |
| | | | | 703/18 |
| 2019/0044340 | A1* | 2/2019 | Jacobson | G05B 19/042 |

OTHER PUBLICATIONS

Hassan et al., Continuous Stability Monitoring of DC Microgrids Using Controlled Injection, 2019 IEEE Applied Power Electronics Conference and Exposition (APEC), Mar. 17, 2019, pp. 1357-1364, IEEE, Anaheim.

(Continued)

*Primary Examiner* — Giovanni Astacio-Oquendo
*Assistant Examiner* — Dilara Sultana
(74) *Attorney, Agent, or Firm* — Kunzler Bean & Adamson; Bruce R. Needham

(57) ABSTRACT

An apparatus monitoring system stability of a DC power system includes a switching power converter with a control loop. The converter is connected to a DC bus of the system. A monitoring loop injected into the control loop includes a sensor circuit monitoring voltage and current of the DC bus and a small signal injector producing a periodic signal with variable amplitude and frequency and injects the periodic signal on a reference signal of the control loop. The monitoring loop includes a stability measurement circuit that varies a frequency input to the small signal injector until the periodic signal has a frequency equal to a system minor loop gain crossover frequency of an impedance ratio of a converter closed loop output impedance and an impedance of the DC power system. The monitoring loop includes a measurement output circuit that outputs a DC power system stability margin at the crossover frequency.

20 Claims, 13 Drawing Sheets

(56) References Cited

OTHER PUBLICATIONS

Morroni et al., An Online Stability Margin Monitor for Digitally Controlled Switched-Mode Power Supplies, IEEE Transactions on Power Electronics, Nov. 2009, pp. 2639-2648, vol. 24, No. 11, IEEE.

Hassan et al., Nodal Impedance-Based Stability Analysis of DC Nanogrids, 2018 IEEE 19th Workshop on Control and Modeling for Power Electronics (COMPEL), Jun. 25, 2018, pp. 1-7, Italy.

Lu et al., Stability Enhancement Based on Virtual Impedance for DC Microgrids with Constant Power Loads, IEEE Transactions on Smart Grid, 2015, pp. 2770-2783, IEEE.

Zhang et al., Stabilization of Cascaded DC/DC Converters via Adaptive Series-Virtual-Impedance Control of the Load Converter, IEEE Transactions on Power Electronics, Sep. 2016, pp. 6057-6063, vol. 31, No. 9, IEEE.

Guo et al., Stability Analysis and Damping Enhancement Based on Frequency-Dependent Virtual Impedance for DC Microgrids, IEEE Journal of Emerging and Selected Topics in Power Electronics, Aug. 10, 2016, pp. 338-350, vol. 5, Issue 1, IEEE.

Khodamoradi et al., On-Line Stability Monitoring for Power Converters in DC Microgrids, 2017 IEEE Second International Conference on DC Microgrids (ICDCM), Jun. 27, 2017, pp. 302-308, IEEE, Nuremburg.

Sallinen et al., Stability Analysis and Adaptive Resonance Damping of Multi-Converter System Applying Sidirectional Converter, 2020 IEEE 21st Workshop on Control and Modeling for Power Electronics (COMPEL), Nov. 9, 2020, IEEE, Aalborg.

\* cited by examiner (a)

(b)

(a)

(b)

POWER ELECTRONIC INSTRUMENT FOR CONTINUOUSLY MONITORING STABILITY AND STABILIZING A DC MICROGRID

CROSS-REFERENCES TO RELATED APPLICATIONS

This application claims the benefit of U.S. Provisional Patent Application No. 62/990,770 entitled "A POWER ELECTRONIC INSTRUMENT FOR CONTINUOUSLY MONITORING STABILITY AND STABILIZING A DC MICROGRID" and filed on Mar. 17, 2020 for Rohail Hassan, et al., which is incorporated herein by reference for all purposes.

FIELD

This invention relates to direct current ("DC") microgrids and more particularly relates to stability control of DC microgrids.

BACKGROUND

Owing to the continued push towards electrified transportation and integration of renewables, the DC microgrids of the future are expected to be much more dynamic than they have been in the past. Future DC microgrids are expected to incorporate different kinds of sources such as renewable energy and fuel-based generators. They are expected to be reconfigurable, have bidirectional converters interfacing energy storage, and may have constant power, intermittent or plug and play loads. Examples of such systems can be found in all-electric aircraft, electric ships and DC fast charging stations and are expected to be configured as shown in FIG. 1. Stable operation of these microgrids is challenged by the negative incremental resistance behavior of the constant power loads as well as interactions among the controllers of the interconnected converters.

Traditional methods of designing the system to handle all possible scenarios lead to an overdesigned system including oversized filters and slow controllers. To avoid system overdesign, active stabilizing techniques and adaptive tuning techniques have been proposed. In some references, online measurements of system health or frequency response were used to auto-tune the digital controllers of the converters to improve transient performance and stability. In other references, an active stabilizer was proposed to add virtual damping in the system based on a measured oscillation frequency at the onset of instability. Application of these auto-tuning and active damping techniques requires online measurement of system impedances or system health, for which several methods have been proposed.

These methods typically use wide-band perturbation followed by a Fourier transform to measure impedances and derive the system stability or tuning parameters from them. Wideband perturbation have been proposed in some instances to measure alternating current ("AC") grid impedance for adaptive control. Cross-correlation methods have also been proposed to find the input and output impedances of cascaded converters. A common drawback of the existing methods is that they are computationally intensive and, for microgrids with multiple sources and loads, require an additional converter to perform the analysis.

SUMMARY

An apparatus to monitor power system stability of a DC power system comprising a DC bus includes a switching power converter with a control loop. The switching power converter is connected to a direct current ("DC") bus of a DC power system. The apparatus includes a monitoring loop injected into the control loop. The monitoring loop includes a sensor circuit configured to monitor voltage of the DC bus and current to the DC bus and a small signal injector configured to produce a periodic signal that includes a variable amplitude and a variable frequency and to inject the periodic signal on a reference signal of the control loop. The monitoring loop includes a stability measurement circuit configured to vary a frequency input to the small signal injector until a fundamental component of the periodic signal has a frequency equal to a system minor loop gain crossover frequency of an impedance ratio of a converter closed loop output impedance and an impedance of the DC power system. The impedance ratio is based on the monitored voltage and current. The monitoring loop includes a measurement output circuit configured to output a DC power system stability margin at the system minor loop gain crossover frequency.

Another apparatus for dynamic virtual impedance ("DVI") includes a switching power converter with a control loop. The switching power converter is connected to a DC bus of a DC power system. A DVI loop is injected into the control loop. The DVI loop includes a sensor circuit configured to monitor voltage of the DC bus and current to the DC bus. The DVI loop includes a stability margin monitoring circuit configured to output a DC power system stability margin at the system minor loop gain crossover frequency. The DVI loop includes a DVI signal injector configured to inject a DVI signal onto the control loop based on the voltage of the DC bus or the current to the DC bus, the system minor loop gain crossover frequency and a stability margin error signal. The stability margin error signal includes a difference between the DC power system stability margin and a stability margin reference. The DVI signal emulates an impedance in parallel or series to an output of the switching power converter.

Another apparatus to monitor power system stability of a DC power system comprising a DC bus includes a switching power converter with a control loop. The switching power converter is connected to a DC bus of a DC power system. The apparatus includes a monitoring loop injected into the control loop. The monitoring loop includes a sensor circuit configured to monitor voltage of the DC bus and current to the DC bus and a small signal injector configured to produce a periodic signal with a variable amplitude and a variable frequency and to inject the periodic signal on a reference signal of the control loop. The monitoring loop includes a stability measurement circuit configured to vary a frequency input to the small signal injector until a fundamental component of the periodic signal has a frequency equal to a system minor loop gain crossover frequency of an impedance ratio of a converter closed loop output impedance and an impedance of the DC power system represented by a ratio of the monitored voltage of the DC bus and a DC power system voltage.

The DC power system voltage is replicated as a product of the monitored current to the DC bus and a model of an output impedance of the switching power converter. The stability measurement circuit derives a crossover error signal based on a difference between the monitored voltage of the DC bus and the DC power system voltage and the stability measurement circuit varies the frequency to the small signal injector until the fundamental component of the periodic signal has a frequency equal to a system minor loop gain crossover frequency by varying the frequency to the small signal injector based on the crossover error signal. The monitoring loop includes a measurement output circuit configured to output a DC power system stability margin at the system minor loop gain crossover frequency.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
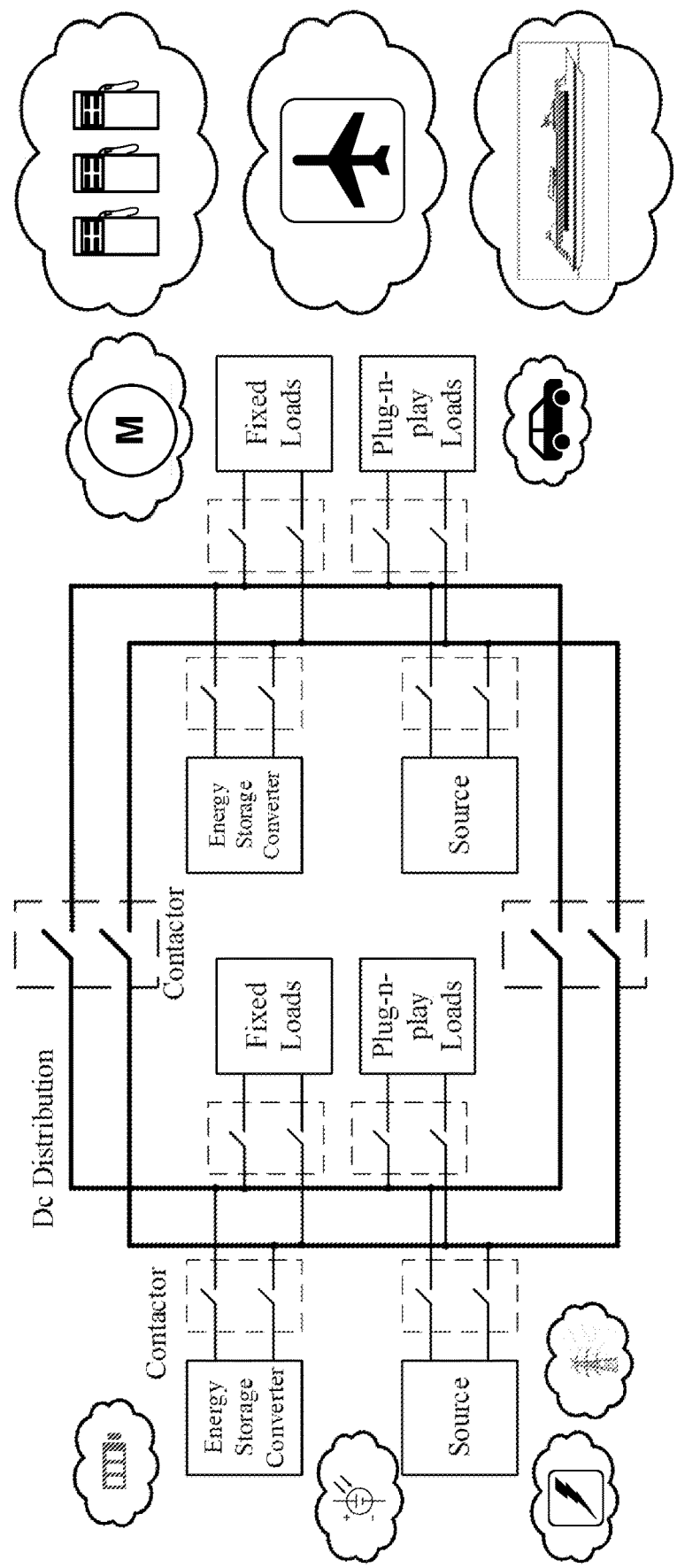
FIG. 1 is a schematic block diagram of one embodiment representative future DC microgrid system.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

An apparatus to monitor power system stability of a DC power system comprising a DC bus includes a switching power converter with a control loop. The switching power converter is connected to a direct current ("DC") bus of a DC power system. The apparatus includes a monitoring loop injected into the control loop. The monitoring loop includes a sensor circuit configured to monitor voltage of the DC bus and current to the DC bus and a small signal injector configured to produce a periodic signal that includes a variable amplitude and a variable frequency and to inject the periodic signal on a reference signal of the control loop. The monitoring loop includes a stability measurement circuit configured to vary a frequency input to the small signal injector until a fundamental component of the periodic signal has a frequency equal to a system minor loop gain crossover frequency of an impedance ratio of a converter closed loop output impedance and an impedance of the DC power system. The impedance ratio is based on the monitored voltage and current. The monitoring loop includes a measurement output circuit configured to output a DC power system stability margin at the system minor loop gain crossover frequency.

In some embodiments, the monitored current to the DC bus equals output current from the switching power converter such that a ratio of the converter closed loop output impedance and the impedance of the DC power system is represented by a ratio of the monitored voltage of the DC bus and a DC power system voltage. The stability measurement circuit derives the DC power system voltage by multiplying the monitored current to the DC bus by a model of an output impedance of the switching power converter.

In other embodiments, the system minor loop gain crossover frequency occurs when the monitored voltage of the DC bus equals the DC power system voltage and the stability measurement circuit derives a crossover error signal based on a difference between the monitored voltage of the DC bus and the DC power system voltage. The stability measurement circuit varies the frequency to the small signal injector until the fundamental component of the periodic signal has a frequency equal to the system minor loop gain crossover frequency by varying the frequency to the small signal injector based on the crossover error signal. In other embodiments, the measurement output circuit derives the DC power system stability margin as a difference between 180 degrees and a phase shift between the monitored voltage of the DC bus and the DC power system voltage. In other embodiments, the stability measurement circuit derives the crossover error signal based on a difference between a peak value of the monitored voltage of the DC bus and a peak value of the DC power system voltage.

In some embodiments, the stability measurement circuit includes an amplitude monitoring circuit configured to maintain an amplitude of the monitoring loop at an amplitude reference value. In other embodiments, the small signal injector varies the amplitude of the periodic signal in response to an amplitude error signal from the amplitude monitoring circuit and the amplitude monitoring circuit varies the amplitude error signal as a function of the amplitude reference value and the monitored voltage of the DC bus. In other embodiments, the periodic signal includes a sinusoidal waveform or a square waveform. In other embodiments, the stability measurement circuit includes a voltage bandpass filter configured to output the monitored voltage of the DC bus at the system minor loop gain crossover frequency and a current bandpass filter configured to output the monitored current to the DC bus at the system minor loop gain crossover frequency.

Another apparatus for dynamic virtual impedance ("DVI") includes a switching power converter with a control loop. The switching power converter is connected to a DC bus of a DC power system. A DVI loop is injected into the control loop. The DVI loop includes a sensor circuit configured to monitor voltage of the DC bus and current to the DC bus. The DVI loop includes a stability margin monitoring circuit configured to output a DC power system stability margin at a system minor loop gain crossover frequency. The DVI loop includes a DVI signal injector configured to inject a DVI signal onto the control loop based on the voltage of the DC bus or the current to the DC bus, the system minor loop gain crossover frequency and a stability margin error signal. The stability margin error signal includes a difference between the DC power system stability margin and a stability margin reference. The DVI signal emulates an impedance in parallel or series to an output of the switching power converter.

In some embodiments, the apparatus includes a stability tuning circuit configured to continuously tune a center frequency, an amplitude at the center frequency and/or a width of an impedance flat region of the emulated impedance. In other embodiments, the stability tuning circuit continuously tunes the center frequency in response to changes to the system minor loop gain crossover frequency and the stability tuning circuit continuously tunes the amplitude at the center frequency in response to the stability margin error.

In some embodiments, the stability margin monitoring circuit includes a small signal injector configured to produce a periodic signal with a variable amplitude and a variable frequency and to inject the periodic signal on a reference signal of the control loop. In the embodiment, the stability margin monitoring circuit includes a stability measurement circuit configured to vary a frequency input to the small signal injector until a fundamental component of the periodic signal has a frequency equal to the system minor loop gain crossover frequency of an impedance ratio of a converter closed loop output impedance and an impedance of the DC power system. The impedance ratio is based on the monitored voltage and current.

In other embodiments, the monitored current to the DC bus equals output current from the switching power converter such that a ratio of the converter closed loop output impedance and the impedance of the DC power system is represented by a ratio of the monitored voltage of the DC bus and a DC power system voltage. The stability measurement circuit derives the DC power system voltage by multiplying the monitored current to the DC bus by a model of an output impedance of the switching power converter. In other embodiments, the system minor loop gain crossover frequency occurs when the monitored voltage of the DC bus equals the DC power system voltage and the stability measurement circuit derives a crossover error signal based on a difference between the monitored voltage of the DC bus and the DC power system voltage. The stability measurement circuit varies the frequency to the small signal injector until the fundamental component of the periodic signal has a frequency equal to the system minor loop gain crossover frequency by varying the frequency to the small signal injector based on the crossover error signal.

In some embodiments, the impedance emulated by the DVI signal includes an inductance-resistance-capacitance circuit with a center frequency at the system minor loop gain crossover frequency with a capacitance characteristic at low frequency and an inductance characteristic at high frequency and the center frequency is a resonant frequency of the inductance and capacitance. In other embodiments, the control loop is a current control loop and the DVI signal is a current injection signal derived by multiplying the monitored voltage of the DC bus by a reciprocal of a DVI impedance defined as:

$$\frac{1}{Z_{vi}(s)} = \frac{s\frac{(2\pi f)\sqrt{b}}{r}}{s^2 + s(2\pi f)\sqrt{b} + (2\pi f)^2}$$

where:
r is the control output emulating a virtual resistance,
f is the system minor loop gain crossover frequency,
b is a parameter to modify the frequency of DVI,
s is a LaPlace variable, and
$Z_{vi}(s)$ is the DVI impedance.

Another apparatus to monitor power system stability of a DC power system comprising a DC bus includes a switching power converter with a control loop. The switching power converter is connected to a DC bus of a DC power system. The apparatus includes a monitoring loop injected into the control loop. The monitoring loop includes a sensor circuit configured to monitor voltage of the DC bus and current to the DC bus and a small signal injector configured to produce a periodic signal with a variable amplitude and a variable frequency and to inject the periodic signal on a reference signal of the control loop. The monitoring loop includes a stability measurement circuit configured to vary a frequency input to the small signal injector until a fundamental component of the periodic signal has a frequency equal to a system minor loop gain crossover frequency of an impedance ratio of a converter closed loop output impedance and an impedance of the DC power system represented by a ratio of the monitored voltage of the DC bus and a DC power system voltage.

The DC power system voltage is replicated as a product of the monitored current to the DC bus and a model of an output impedance of the switching power converter. The stability measurement circuit derives a crossover error signal based on a difference between the monitored voltage of the DC bus and the DC power system voltage and the stability measurement circuit varies the frequency to the small signal injector until the fundamental component of the periodic signal has a frequency equal to the system minor loop gain crossover frequency by varying the frequency to the small signal injector based on the crossover error signal. The monitoring loop includes a measurement output circuit configured to output a DC power system stability margin at the system minor loop gain crossover frequency.

In some embodiments, the apparatus includes a DVI signal injector configured to inject a DVI signal onto the control loop based on the voltage of the DC bus or the current to the DC bus, the system minor loop gain crossover frequency and a stability margin error signal. The stability margin error includes a difference between the DC power system stability margin and a stability margin reference. The DVI signal emulates an impedance in series or parallel to an output of the switching power converter. In other embodiments, the apparatus includes a stability tuning circuit configured to continuously tune a center frequency, an amplitude at the center frequency and/or a width of an impedance flat region of the emulated impedance. The stability tuning circuit continuously tunes the center frequency in response to changes to the system minor loop gain crossover frequency and wherein the stability tuning circuit continuously tunes the amplitude at the center frequency in response to the stability margin error.

A novel system stability monitor is presented herein which can be added onto any existing converter in the system as an auxiliary function and that continuously monitors the stability margin of the interconnected system. The stability margin evaluation is enabled by Nodal Stability Analysis which is a generalized impedance-based stability analysis method especially suited for dynamic DC microgrids with various interconnected sources, loads and bidirectional converters. The monitor itself is a continuous monitoring method developed to monitor the phase margin of a converter loop gain. The proposed continuous monitor injects a controlled single-frequency perturbation using one of the converters already in the system, with a small amplitude that does not affect the normal operation. The proposed method can be used in any interconnected system for proactively monitoring and maintaining the system stability, and its continuous nature would enable development of new techniques in adaptive stability enhancement of DC microgrids.

Nodal Stability Analysis

The proposed continuous system stability monitoring technique evaluates stability using measurements at the terminal of the converter that incorporates it. The approach relies on measurements directly available to the converter, namely the DC link voltage at its output and its own output current. This data provides information about the system impedance as seen from the output terminals of the monitoring converter. The proposed approach uses impedance-based stability analysis to evaluate the stability margin. However, the monitoring converter cannot divide the system into source and load subsystems as required by traditional impedance-based stability analysis methods. This is because the impedance that the monitoring converter sees is the parallel combination of all sources, loads and bidirectional converters connected in the system and there is no way for it to distinguish sources from loads in the impedance measurement at its output terminals.

Hence, traditional methods cannot be used with the proposed monitor. The Nodal Stability Analysis summarized here presents an impedance-based analysis method that does not require identification or grouping of sources and loads, making it the ideal candidate for such applications.

Figure 2:
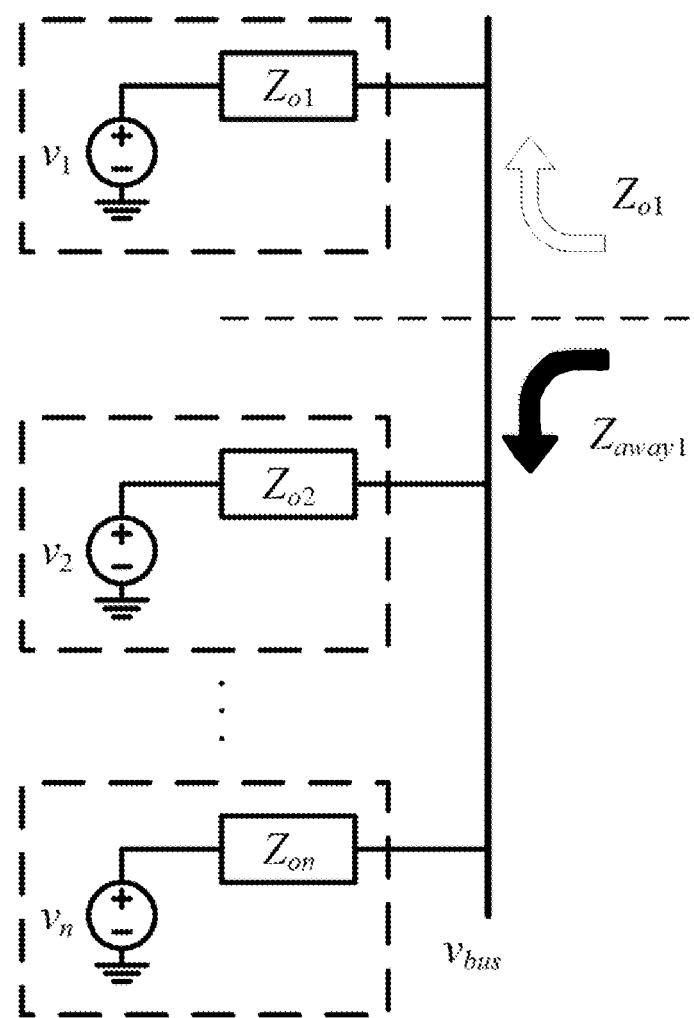
FIG. 2 is a schematic block diagram of one embodiment of a generic DC microgrid showing an arbitrary system partitioning.

Consider a DC microgrid comprising n converters connected to a common DC bus, as shown in FIG. 2, where all converters are represented by their Thevenin equivalent. The small-signal DC bus voltage is given by:

$$V_{bus} = \left(\sum_{i=1}^{n} \frac{v_i}{z_{oi}}\right) Z_{bus}, \tag{1}$$

where:

$$Z_{bus}=(Z_{o1}//Zo2// \ldots //Z_{on}), \quad (2)$$

All variables in equations (1) and (2) are functions of the Laplace variable s, $V_i$ and $Z_{oi}$ are the Thevenin equivalent voltage and output impedance of the i-th converter, respectively, and $Z_{bus}$ is the overall bus impedance from the parallel combination of all the converter output impedances. Assuming the converters are individually stable when connected to an ideal DC bus, the system stability is given by the stability of $Z_{bus}$. The stability of the DC bus impedance $Z_{bus}$ is determined by expanding equation (2). One such expansion of $Z_{bus}$ is given by:

$$Z_{bus} = \frac{z_{o1} z_{away,1}}{z_{o1} + z_{away,1}} = \frac{z_{o1}}{1+\frac{z_{o1}}{z_{away,1}}} = \frac{z_{away,1}}{1+\frac{z_{away,1}}{z_{o1}}}, \quad (3)$$

where $Z_{away,1}$ is the parallel combination of all converter impedances except $Z_{o1}$. The expansion shown in equation (3) corresponds to partitioning the system at the terminal of the arbitrary converter 1, as shown in FIG. 2. Equation (3) shows $Z_{bus}$ expressed in the form of a closed loop system representing interactions of all the interconnected converters and with a minor loop gain represented by the ratio of the output impedance $Z_{o1}$ and the impedance of the rest of the system, $Z_{away,1}$. From equation (3), the DC bus impedance is stable if the minor loop gain $Z_{o1}/Z_{away,1}$ satisfies the Nyquist stability criterion.

It is shown through hardware results that the minor loop gain $Z_o/Z_{away}$ can be evaluated at the terminal of any converter in the system, and it is not necessary to group or identify source and load converters in $Z_{away}$ to perform the analysis. This property is utilized herein to develop the continuous monitoring technique which evaluates the system stability by continuously measuring the crossover frequency and phase margin of the minor loop gain given by the ratio of $Z_o$ to $Z_{away}$.

Continuous Stability Margin Monitor

From equation (3), the minor loop gain of the microgrid system is given by $Z_o/Z_{away}$. If both impedances are perturbed using the same current perturbation $i_o$, then the minor loop gain can be written as:

$$\text{Minor loop gain} = \frac{z_o}{z_{away}} = \frac{v_s i_o}{v_o i_o} = \frac{v_s}{v_o}, \quad (4)$$

where $v_s$ is the response of $Z_o$ and $v_o$ is the response of $Z_{away}$, to $i_o$. Utilizing the freedom of system partitioning, any converter in the system can be assigned the monitoring task. Typically, converters are switching power converters that include a control loop. The switching power converters contemplated herein have a DC output and are connected to a DC bus. The input to the switching power converters may be alternating current ("AC") or DC. The control loop generally controls switching in the switching power converters. As used herein, a switching power converter may be called a converter.

Figure 3A:
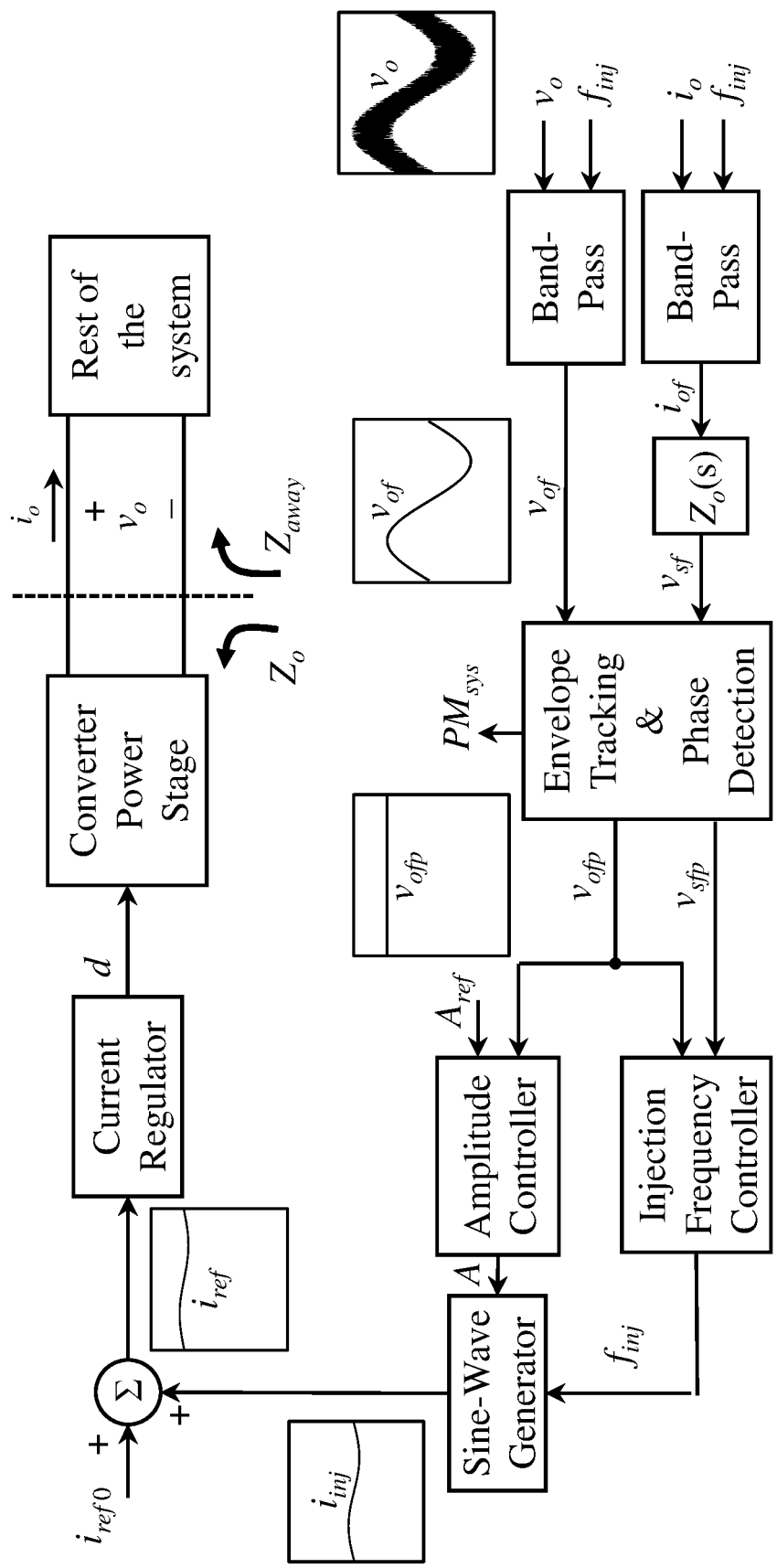
FIG. 3A is a schematic block diagram of one embodiment of a continuous stability margin monitor.
Figure 3B:
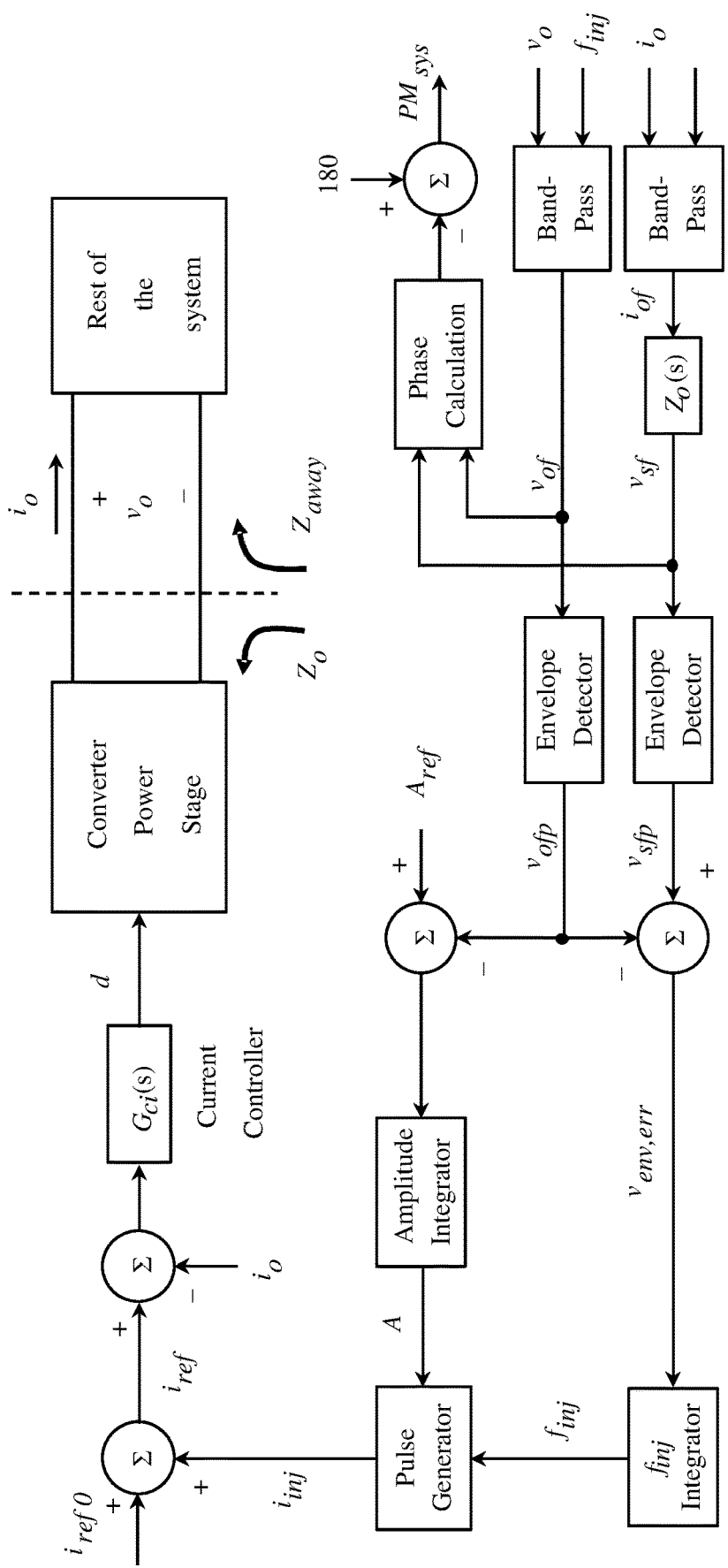
FIG. 3B is a schematic block diagram of another embodiment of a continuous stability margin monitor.

The converter assigned to stability monitoring would inject a current perturbation in the system and directly measure $v_o$ (the response of $Z_{away}$) and $i_o$, as indicated in the overall schematic of the continuous monitor in FIGS. 3A and 3B. The measured $i_o$ is then used with the analytical model of the converter output impedance to calculate $v_s$. With $v_s$ and $v_o$, the system stability margin can be determined since the frequency at which the amplitudes of $v_s$ and $v_o$ match is the minor loop gain crossover frequency, and the phase margin of the minor loop gain is the phase difference of $v_s$ and $v_o$ at that minor loop gain crossover frequency.

FIG. 3A is a schematic block diagram of one embodiment of a continuous stability margin monitor. The sine-wave generator injects a small sine wave onto a reference signal where the frequency of the sine wave has a variable injection frequency $f_{inj}$ and amplitude A. The injection frequency $f_{inj}$ is adjusted to match the minor loop gain crossover frequency, which occurs when $v_{ofp}$ matches $v_{sfp}$ where $v_{ofp}$ is a representation of the voltage of the switching power converter and $v_{sfp}$ is a voltage transformation of the output current $i_o$. The amplitude A is controlled to match a reference amplitude $A_{ref}$.

FIG. 3B is a schematic block diagram of another embodiment of a continuous stability margin monitor. FIG. 3B is a particular implementation of the continuous stability monitor of FIG. 3A that determines when $v_{ofp}$ matches $v_{sfp}$ by determining a difference between $v_{ofp}$ and $v_{sfp}$ and by determining the amplitude input A by determining a difference between $v_{ofp}$ and $A_{ref}$. FIG. 3B includes a square wave pulse generator, which is typically less expensive than a sine wave generator. A sine wave generator may also be used with the circuit of FIG. 3B.

The sine wave generator of FIG. 3A and the pulse generator of FIG. 3B E, are small signal injectors that produce a periodic signal comprising a variable amplitude and a variable frequency and to inject the periodic signal on a reference signal of the control loop. Typically, the amplitude of the period signal is large enough to be detected above ambient noise but is much smaller than an amplitude of the reference signal upon which the periodic signal is injected.

Figure 3C:
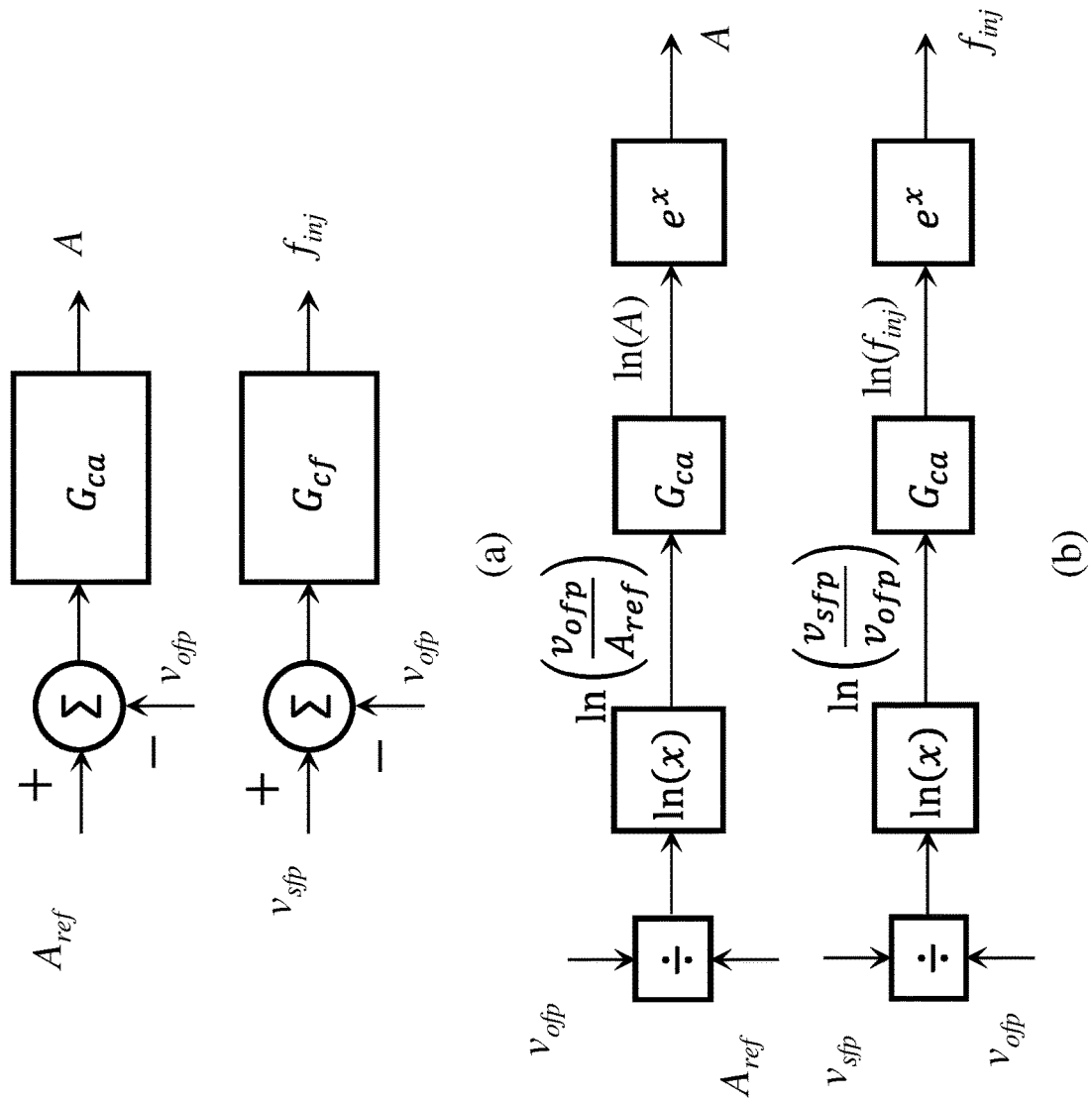
FIG. 3C is a schematic block diagram of a) an embodiment of a differential error and compensator and b) an alternate embodiment of a ratio error and compensator for the continuous stability margin monitor of FIG. 3A.

FIG. 3C is a schematic block diagram of a) an embodiment of a differential error and compensator and b) an alternate embodiment of a ratio error and compensator for the continuous stability margin monitor of FIG. 3A. The differential error and compensator in FIG. 3C (a) is similar to FIG. 3B. The $f_{inj}$ integrator is compensation term for the injection frequency input $f_{inj}$ and the amplitude integrator is a compensation term for the amplitude input A.

In FIGS. 3A and 3B, a monitoring loop is injected into the control loop of the switching power converter where the injection point is the summation block of the reference signal and an injected signal. In FIGS. 3A and 3B, the control loop is a current control loop and the monitoring loop injects a current signal $i_{inj}$ onto the current reference signal $i_{ref\ 0}$. In other embodiments, the control loop is a voltage loop and the monitoring loop is injected onto a voltage reference signal.

The monitoring loop includes a sensor circuit configured to monitor voltage of the DC bus $v_o$ and current to the DC bus $i_o$. Typically, the sensor circuit monitors voltage of the DC bus $v_o$ with a connection to a positive output terminal of the output bus and monitors current of the DC bus $i_o$ with a current sensor. The current sensor may be a resistor, a hall effect sensor, or other current sensor suitable for monitoring DC current.

The monitoring loop includes a small signal injector, a stability measurement circuit and a measurement output circuit. The small signal injector is configured to produce a periodic signal comprising a variable amplitude and a variable frequency and is configured to inject the periodic signal on the reference signal of the control loop. The stability measurement circuit is configured to vary a frequency input to the small signal injector until a fundamental component of the periodic signal has a frequency equal to a system minor loop gain crossover frequency of an impedance ratio of a converter closed loop output impedance $Z_o$ and an impedance of the DC power system $Z_{away}$. The impedance ratio is based on the monitored voltage $v_o$ and current $i_o$ of the DC bus. The measurement output circuit is configured to output a DC power system stability margin $PM_{sys}$ at the system minor loop gain crossover frequency $f_{inj}$.

As in equation (4), the monitored current to the DC bus equals output current from the switching power converter $i_o$ such that a ratio of the converter closed loop output impedance $Z_o$ and the impedance of the DC power system $Z_{away}$ is represented by a ratio of the monitored voltage of the DC bus $v_o$ and a DC power system voltage $v_s$. The stability measurement circuit derives the DC power system voltage $v_s$ by multiplying the monitored current to the DC bus $i_o$ by a model of an output impedance of the switching power converter $Z_o$ (s), which is described further below.

A. Injection and Response Filtering.

As shown in FIG. 3B, a small signal injector in the form of a pulse generator outputs a square wave current reference $i_{inj}$ with frequency $f_{inj}$ and amplitude $\pm A$, which is added on top of the base current reference $i_{ref0}$ and fed into the converter output current controller. The overall current reference, $i_{ref}$, looks like that shown in FIG. 4. The stability measurement circuit in FIG. 3B includes the circuitry feeding the pulse generator. In some embodiments, the stability measurement circuit includes a voltage bandpass filter configured to output the monitored voltage of the DC bus $v_o$ at the system minor loop gain crossover frequency $f_{inj}$ and a current bandpass filter configured to output the monitored current to the DC bus $i_o$ at the system minor loop gain crossover frequency $f_{inj}$.

The resulting $i_o$ from the converter and the response voltage $v_o$ are measured and fed into a voltage bandpass filter tuned at the injection frequency $f_{inj}$. Each bandpass filter is made online tunable and is of the form:

$$G_{bp}(s) = \frac{\left(\frac{2\pi f_{inj}}{Q}\right)s}{s^2 + \frac{2\pi f_{inj}}{Q}s + (2\pi f_{inj})^2}, \quad (5)$$

where Q is the quality factor of the filter (usually set high), and $f_{inj}$ is the same frequency at which $i_{inj}$ is generated. The dynamic parameter $f_{inj}$ in equation (5) requires that the parameters of the voltage bandpass filters be evaluated continuously as $f_{inj}$ changes, making it helpful if the rate of change of $f_{inj}$ be much smaller than the value of $f_{inj}$. The outputs of the bandpass filters, $i_{of}$ and $v_{of}$, contain only the frequency component of $i_o$ at $f_{inj}$ and its response to $Z_{away}$ respectively. Filtered current, $i_{of}$ is then fed into the analytical model of $Z_o$ to calculate $v_{sf}$. The model of $Z_o$ (labeled $z_o(s)$ in FIG. 3B) is based the topology of the converter (labeled "converter power stage" in FIG. 3B). $Z_o$ is a frequency dependent function. In some embodiments, $Z_o$ is frequency dependent for a range of frequencies above and below an expected $f_{inj}$.

In some embodiments the stability measurement circuit includes a peak-detection algorithm (e.g. envelope detectors in FIG. 3B) to find the peak-to-peak amplitudes of $v_{of}$ and $v_{sf}$ at the injection frequency $f_{inj}$, given by $v_{ofp}$ and $v_{sfp}$. The error between $v_{ofp}$ and $v_{sfp}$ is integrated to find the frequency where the error is zero, i.e. where $v_{sfp}=v_{ofp}$. For example, as depicted in FIG. 3B, an output of a summation block $v_{env,err}$ that subtracts $v_{ofp}$ from $v_{sfp}$ is fed into a compensation block that may include an integrator. In various embodiments, the $f_{inj}$ integrator is a proportional-integral ("PI") control, a proportional-integral-derivative ("PID") control, or the like. Likewise the amplitude integrator may be a proportional-integral ("PI") control, a proportional-integral-derivative ("PID") control, or the like.

B. Injection Control and Phase Margin Evaluation.

The stability measurement circuit includes an amplitude monitoring circuit configured to maintain an amplitude A of the monitoring loop at an amplitude reference value $A_{ref}$. It is desirable to limit the amplitude of the voltage perturbation resulting from the injected current, and also to make sure that the response is detectable. To achieve that, the amplitude of voltage perturbation, $v_{ofp}$, is compared to a reference amplitude $A_{ref}$ and fed into a slow integrator or other suitable compensator which outputs the amplitude of the current injection A. From equation (4), the goal is to inject a perturbation at the impedance crossover frequency where $v_{sfp}=v_{ofp}$. This allows us to define a feedback error (crossover error signal):

$$v_{env,err}=v_{sfp}-v_{ofp} \quad (6)$$

which is integrated, in one embodiment, to output the injection frequency $f_{inj}$. The $f_{inj}$ integrator (also called the frequency integrator) or other suitable compensation changes the injection frequency until it reaches the impedance crossover frequency. Correct operation of this frequency integrator requires the correct sign of the error to be used and, in some embodiments, a good estimate for the integrator initial condition is also used, which can be estimated from analytical models or a one-time measurement using a frequency sweep or other wide-band methods. According to equation (4), as the error of equation (6) goes to zero, the injection frequency, $f_{inj}$, will converge to the crossover frequency of the minor loop gain equation (4), and given by $$f_{c,sys}=f_{inj}|_{f_{inj,err}=0}, \quad (7)$$

here $f_{c,sys}$ is the minor loop gain crossover frequency. Also, when equation (6) goes to zero, the system phase margin, hereby called $PM_{sys}$, is proportional to the phase difference between $v_{of}$ and $v_{sf}$ and is given by:

$$PM_{sys}=180(1-2\Delta t_{zc}f_{inj})|_{f_{env,err}=0}, \quad (8)$$

where $\Delta_{tzc}$ is the time difference between the zero crossings of $v_{sf}$ and $v_{of}$.

Thus, the measurement output circuit is configured to output this DC power system stability margin $PM_{sys}$ at the system minor loop gain crossover frequency $f_{inj}$. The measurement output circuit derives the DC power system stability margin $PM_{sys}$ as a difference between 180 degrees and a phase shift between the monitored voltage of the DC bus $v_o$ and the DC power system voltage $v_s$.

Analysis and Design of the Continuous Monitor

This section discusses modeling of the dynamics of the continuous monitor and the design of its two controllers, namely the $f_{inj}$ integrator and amplitude integrator. An experimental setup from which the models are derived is discussed before the modeling of the monitor dynamics themselves.

A. Hardware Test Setup.

Figure 5:
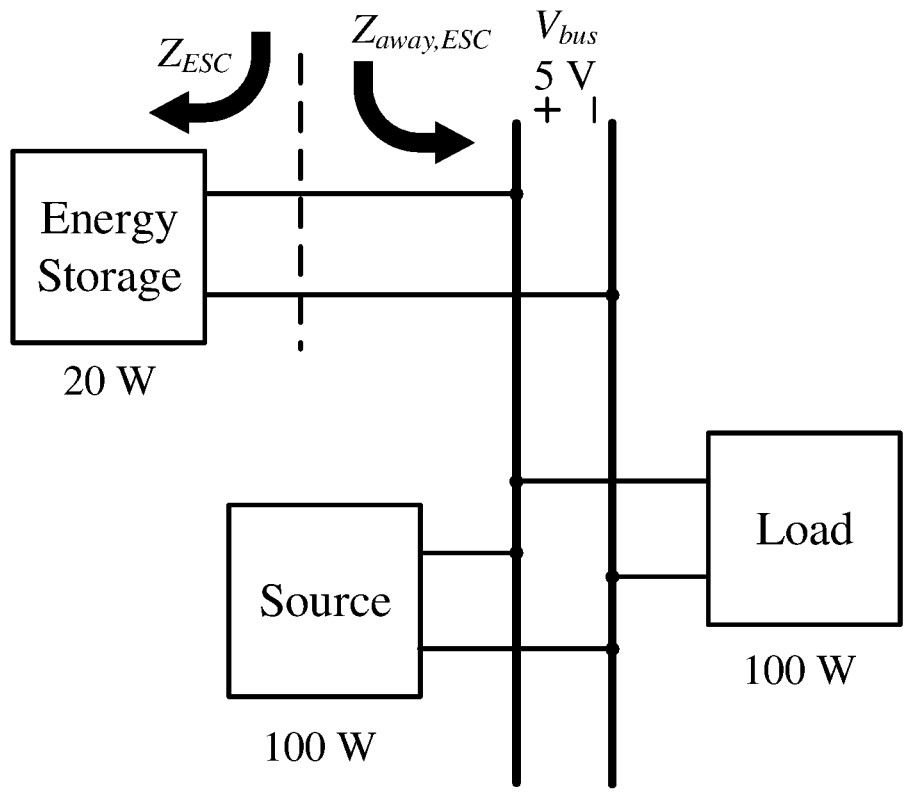
FIG. 5 is a schematic block diagram of one embodiment of a hardware setup system diagram.

To validate the proposed stability margin monitor, a test setup emulating essential parts of a DC microgrid, namely a source converter, a load converter and a bidirectional converter (emulating an energy storage interface) was built as shown in FIG. 5. All converters in FIG. 5 are synchronous buck converters which are chosen for their well understood behavior and impedance models. The source converter and the load converter are each rated for 100 W and have the same control structure as in some references. The source converter has an inner current control loop regulating its output current and an outer voltage controller with droop.

The load converter regulates the voltage at its own output, thereby appearing as a constant power load to the DC bus. The impedance models of the source and the load converters are same as in some references.

An energy storage converter ("ESC"), as depicted in FIG. 5, is chosen as the continuous monitor of the system. The control structure for the ESC is as shown in FIG. 3B. The ESC regulates its output current with a constant reference while an injected signal is added on top of the constant current reference. The impedance model of the ESC is given by:

$$Z_{ESC} = \frac{z_L + v_{in}G_{ci}}{1 + \frac{z_L}{z_C}}, \quad (9)$$

where $V_{in}$ is the input voltage of the ESC, $G_{ci}$ is the current controller, $Z_L$ is the impedance of the inductor of the synchronous buck including its ESR, and $Z_c$ is the impedance of the output shunt filter branch. To evaluate the system stability, the following minor loop gain is evaluated, $$\text{Minor Loop Gain} = \frac{z_{ESC}}{z_{away,ESC}} = \frac{z_{ESC}}{z_{sc} \| z_{Load}} = \frac{v_{sf}}{v_{of}}, \quad (10)$$

where $Z_{sc}$ is the impedance of the source converter while Zion is the impedance of the load converter. The parallel combination of the source and load converter impedances is seen by the ESC. The controller bandwidths of the three converters are listed in Table 1 below.

TABLE I

Control Parameters of Converters In Test Setup

|  | Current control bandwidth (Hz) | Voltage control bandwidth (Hz) | Droop Resistance |
|---|---|---|---|
| Source Converter | 1000 | 500 | 0.0194 |
| Bidirectional ESC | 2000 | N/A | N/A |
| Load Converter | N/A | 160 | N/A |

To help in validating the proposed monitor over a wide operation range, the parameters are intentionally chosen such that the system crossover frequency and phase margin changes significantly as the load converter increases its power.

B. Modeling of the Continuous Monitor Dynamics.

Following an approach similar to other references, we can find the transfer function from $f_{inj}$ to envelope error, i.e.:

$$G_{f_{inj},v_{err}}(j\omega_m) = \frac{\hat{V}_{env,err}(j\omega_m)}{\hat{f}_{inj}(j\omega_m)}, \quad (11)$$

where $v_{env,err}$ is given by equation (6). Similar to other references, the overall transfer function of equation (11) can be evaluated by evaluating the difference of two transfer functions:

$$G_{f_{inj},v_{s,env}}(j\omega_m) = \frac{\hat{V}_{s,env}(j\omega_m)}{\hat{f}_{inj}(j\omega_m)}, \quad (12)$$

and $$G_{f_{inj},v_{o,env}}(j\omega_m) = \frac{\hat{V}_{o,env}(j\omega_m)}{\hat{f}_{inj}(j\omega_m)}, \quad (13)$$

where $v_{s,env}$ represents the small-signal variations in $v_{sfp}$ and $v_{o,env}$ represents the small-signal variations in $v_{ofp}$. The overall transfer function is then found as:

$$G_{f_{inj},v_{err}}(j\omega) = G_{f_{inj},v_{s,env}}(j\omega) G_{f_{inj},v_{o,env}}(j\omega), \quad (14)$$

The derivation of the envelope dynamics treats the small-signal variations in frequency as frequency modulation of the square wave generation, filtered by the bandpass filter of equation (5). It can be shown that equations (12) and (13) can be evaluated as:

$$G_{f_{inj},v_{env}}(j\omega_m) = \frac{4V_{in}}{\pi} \frac{A_0 A_l^* + A_o^* A_u}{\|A_0\|}, \quad (15)$$

where $A_0$, $A_l$ and $A_u$ are defined as:

$$A_0 = G_{plant}(j\omega_m), \quad (16)$$

$$A_l = -\frac{1}{2w_m} G_{plant}[j(\omega_{inj} - \omega_m)],$$

$$A_u = \frac{1}{2w_m} G_{plant}[j(\omega_{inj} + \omega_m)].$$

For evaluating equation (12), $G_{plant\ (jwm)}$ in equation (16) is given by:

$$G_{plant,v_s}(j\omega_m) = G_{i,ESC}(j\omega_m) Z_{ESC}(j\omega_m) G_{bp}(j\omega_m), \quad (17)$$

where $G_{i,ESC}$ $(j\omega_m)$ is the closed loop current transfer function of ESC. For evaluating (13), $G_{plant}$ $(j\omega_m)$ in (16) is given by:

$$G_{plant,v_o}(j\omega_m) = G_{i,ESC}(j\omega_m) Z_{away,ESC}(j\omega_m) G_{bp}(j\omega_m), \quad (18)$$

The dynamics of the perturbation amplitude control loop are also derived by following a reference, which treats the small-signal variations in A as amplitude modulation. It can be shown that for the square wave perturbation of FIG. 3B the amplitude loop has the transfer function:

$$G_{A,v}(j\omega_m) = \frac{4V_{in}}{\pi} \frac{A_0 A_l^* + A_o^* A_u}{\|A_0\|}, \quad (19)$$

where:

$$A_0 = G_{plant}(j\omega_m), \quad (20)$$

$$A_l = -\frac{1}{2\omega_m} G_{plant}[j(\omega_{inj} - \omega_m)],$$

$$A_u = \frac{1}{2\omega_m} G_{plant}[j(\omega_{inj} + \omega_m)].$$

and $$G_{plant}(j\omega_m) = G_{i,ESC}(j\omega_m) Z_{away,ESC}(j\omega_m) G_{bp}(j\omega_m), \quad (21)$$

For the hardware setup described in above, the frequency response of the $f_{inj}$ loop and amplitude loop models were evaluated with an estimated system crossover frequency, $f_{c,sys}$, of 168 Hz and a perturbation amplitude A of 63 mA.

Figure 6:
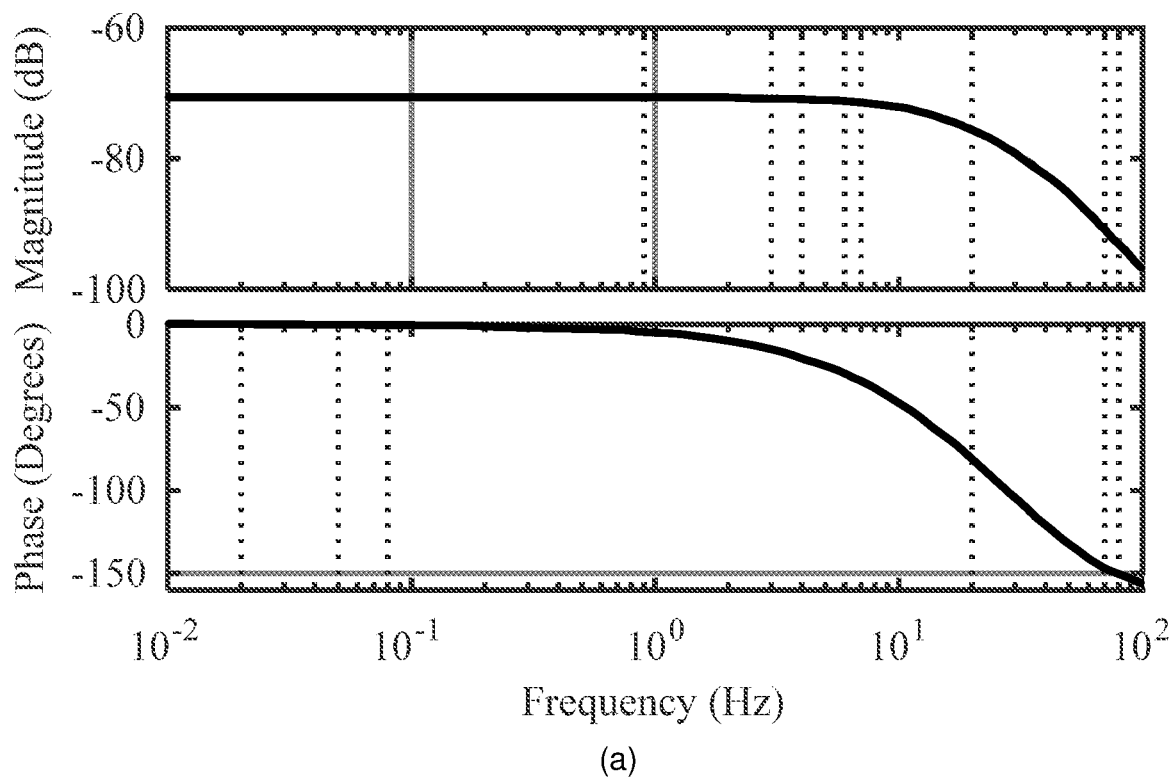
FIG. 6 is a frequency response of the envelope models: (a) $f_{inj}$ loop and, (b) amplitude loop.
Figure 6:
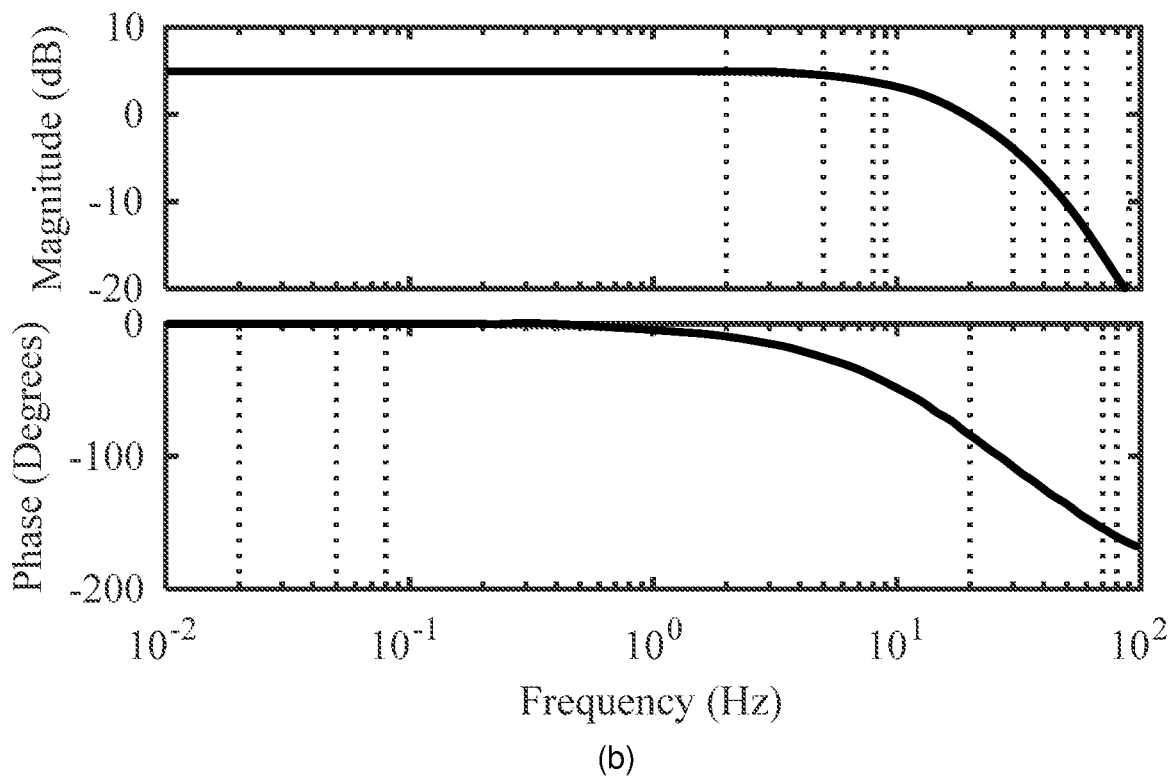

The responses are shown in FIG. 6. It is evident from FIG. 6 that the transfer functions exhibit low pass filter characteristics with a dominant pole pair which is highly damped.

C. Design of the Monitor Controllers.

Unlike designing the controller for monitoring a converter loop gain other references, our goal is to design the controllers for monitoring the minor loop gain of a dynamic system that has multiple converters and whose impedance changes with operating point. We cannot, therefore, rely on complete models for our design as we are not assuming that $Z_{away}$ is known. Hence, we would like to simplify the small-signal models developed above and derive a measurement-based strategy to design the monitor controllers. From above analysis, both the amplitude loop and the frequency loop exhibit low-pass filter characteristics and a dominant pole with a pole frequency of:

$$\omega_1 = \sqrt{\omega_{inj}^2 - 2\omega_{inj}\omega_0\sqrt{1 + \frac{1}{2Q^2}} + \omega_0^2}, \quad (22)$$

where $\omega_0$ is the resonant frequency of the bandpass filter, Q is the quality factor of the bandpass filter and $\omega 1$ is the pole frequency of the dominant pole pair. In the continuous monitor presented here, the bandpass filter resonant frequency is the same as the injection frequency such that $\omega_{inj}=\omega_0$, so the frequency of the dominant pole-pair for the continuous monitor becomes $$\omega_1 = \sqrt{2}\omega_{inj}\sqrt{1 - \sqrt{1 - \frac{1}{4Q^2}}}, \quad (23)$$

Equation (23) shows that the dominant pole frequency is linearly dependent on $f_{inj}$ and that it reduces with increasing Q. While a high Q is desired to extract the single frequency component at $f_{inj}$, a very high Q cannot be used as it would place Wi at a low frequency, reducing the achievable bandwidth for the monitor controllers. In the circuit of FIG. 5, a Q of 5 was used. The DC gain of the $f_{inj}$ loop is proportional to the slope of $G_{plant}$ in equation (16) and is given by:

$$G_{f_{inj},0} = \frac{4A}{\pi} \frac{(\delta\|G_{plant}(j\omega)\|)}{\delta\omega}|_{\omega=\omega_{inj}}, \quad (24)$$

where:

$$G_{plant}(j\omega)=G_{plant,v_s}(j\omega)-G_{plant,v_0}(j\omega), \quad (25)$$

The DC gain of the $f_{inj}$ loop can thus be estimated by measuring $v_{env,err}$ in equation (6) at two frequencies around an estimated $f_{c,sys}$ and finding the slope. Furthermore, the initial value of A, the amplitude of square perturbation, can be set as:

$$A = \frac{\pi}{4} \frac{A_{ref}}{\|z_{away}(j\omega_{c,sys})\|}, \quad (26)$$

where $A_{ref}$ is the desired amplitude of voltage perturbation and $\|Z_{away(j\omega c,sys)}\|$ can be estimated from measurement. Similarly, the DC gain of the amplitude loop is given by a reference as:

$$G_{A,0} = \frac{4}{\pi}\|G_{plant,v_0}(j\omega_{c,sys})\|, \quad (27)$$

where $\|G_{plant,\ v_0(j(t)c,sys)}\|$ can be estimated by measuring $\|v_o\|/\|i_{ref}\|$ at the estimate $f_{c,sys}$. With these simplifications, and observing from FIG. 6 the dominant pole characteristics, the $f_{inj}$ integrator can be designed as $$k_{i,f_{inj}} = \frac{2\pi f_{c,f}}{G_{f_{inj},0}}, \quad (28)$$

where $f_{c,f}$ is the desired crossover frequency of the $f_{inj}$ loop and $k_{i,finj}$ is the integrator gain. Similarly, the amplitude controller can be designed as $$k_{i,A} = \frac{2\pi f_{c,A}}{G_{A,0}}, \quad (29)$$

where $f_{c,f}$ is the desired crossover frequency of the amplitude loop and $k_{i,A}$ is the integrator gain. For both controllers, the crossover frequency is placed much lower than the pole frequency given by equation (23). Once these controllers are designed in continuous time, a suitable method can be used to convert it to discrete time before implementing in a microcontroller or FPGA.

Experimental Results

The hardware tests establish the practicality and applicability of the proposed stability margin monitor in a wide variety of systems by initializing the continuous monitor using only online measurements and the simplified models presented above. Furthermore, tests are performed to evaluate the performance of the continuous monitor with system operating points changing. This is done by varying the load converter power from 0 W to 30 W and monitoring the change in system minor loop gain crossover frequency and phase margin.

A. Analysis of Test Cases.

Figure 7A:
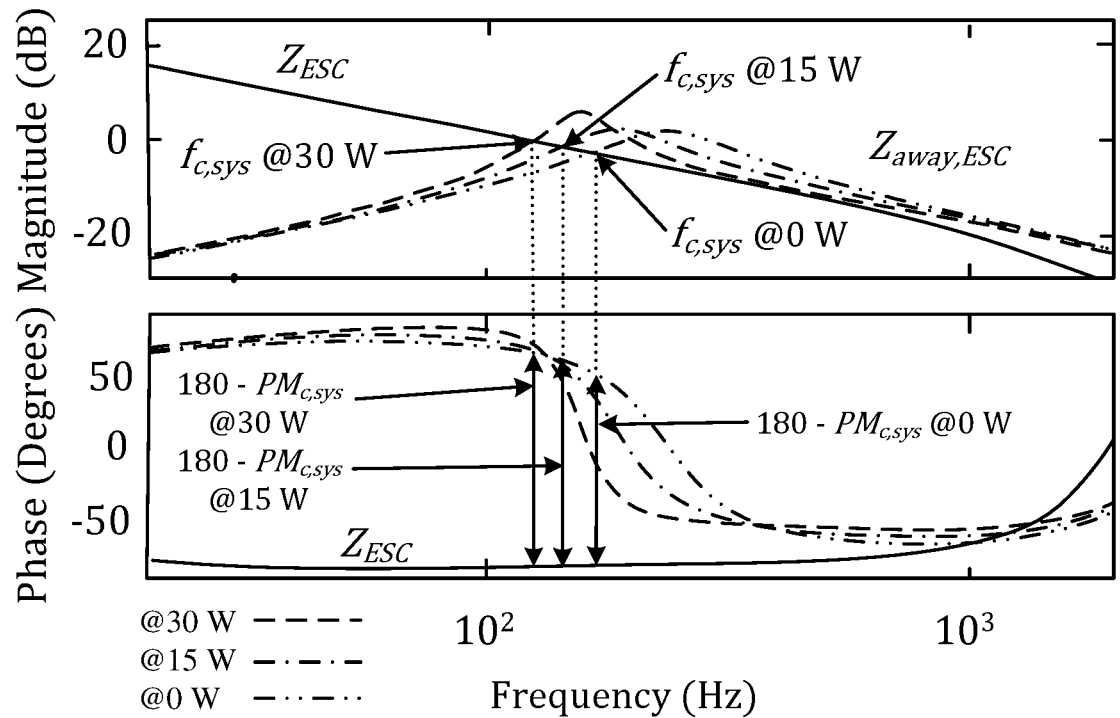
FIG. 7A is a Bode plot of $Z_{ESC}$ and $Z_{away,ESC}$ for load converter powers from 0 W to 30 W.
Figure 7B:
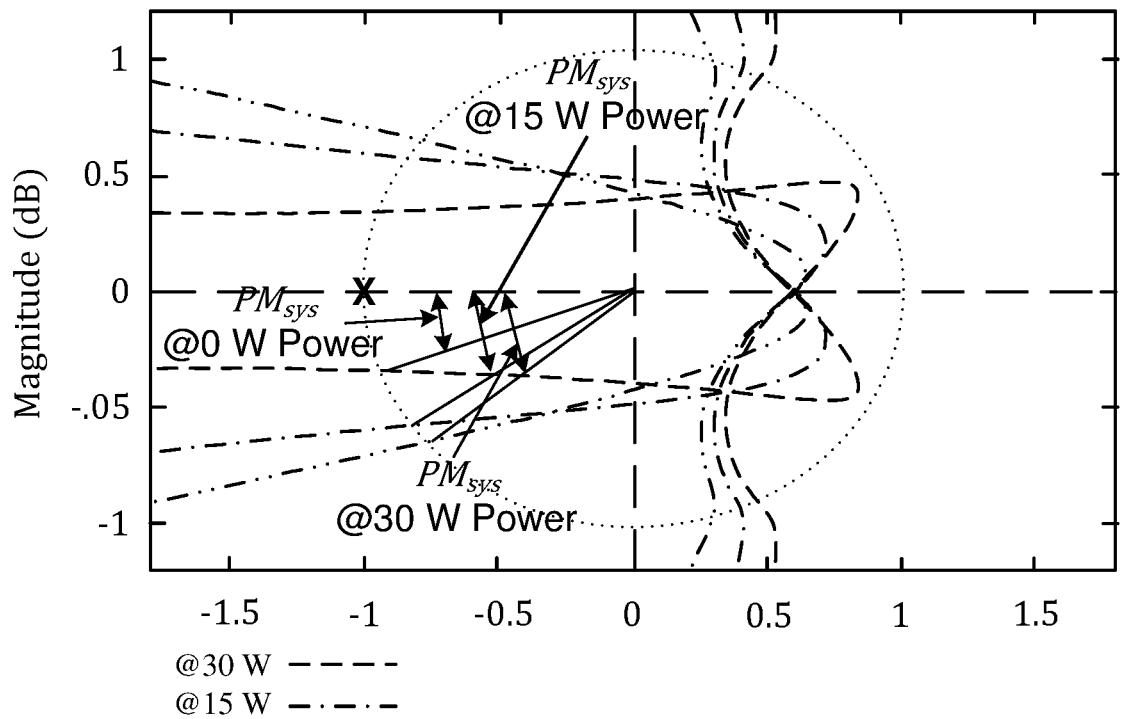
FIG. 7B is a Nyquist plots of the system minor loop gain for load converter powers from 0 W to 30 W.
Figure 7C:
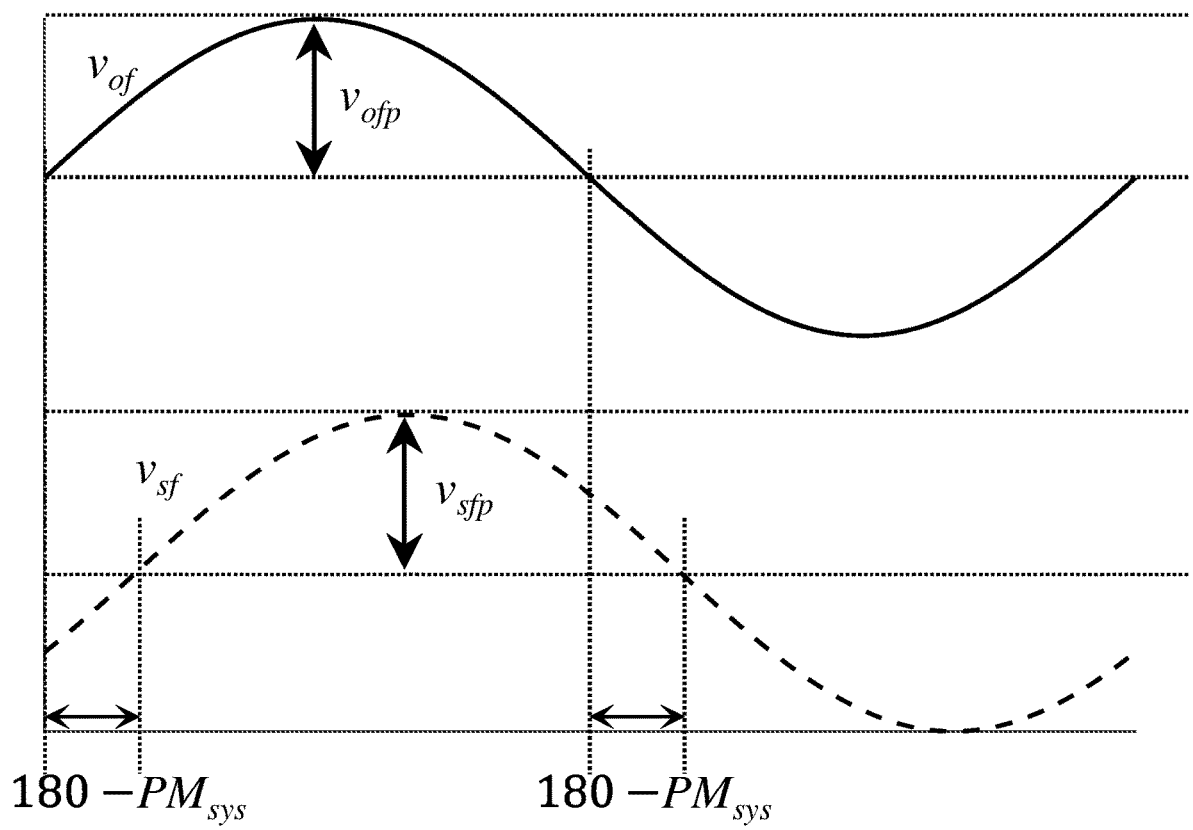
FIG. 7C is a Bode plot indicating measurement of the system phase margin.

As mentioned in above, the current and voltage controllers of the converters in the test setup are designed such that the system crossover frequency, $f_{c,sys}$, given by equation (7) and the system phase margin, $PM_{sys}$, given by equation (8) changes significantly as the load power increases. To have a baseline for comparison, the analytical models of $Z_{ESC}$ and $Z_{away,ESC}$ are computed, where the impedance models of $Z_{sc}$ and $Z_{Load}$ are given in a reference. The frequency response of $Z_{ESC}$ and $Z_{away,ESC}$, and the Nyquist plot of the minor loop gain equation (4) are shown in FIGS. 7A and 7B. It is evident from the bode plots in FIG. 7A that, as the load converter increases its power it changes the impedance seen by the ESC, resulting in a change of $f_{c,sys}$. Similarly, it can be seen from both the bode and Nyquist plots in FIG. 7B that the phase margin $PM_{sys}$ reduces as the load power increases. FIG. 7C is a Bode plot indicating measurement of the system phase margin. FIG. 7C illustrates a phase difference between voltages $v_{of}$ and $v_{sf}$ where $v_{of}$ is a representation of the voltage of the switching power converter and $v_{sf}$ is a voltage transformation of the output current $i_o$. The system phase margin $PM_{sys}$ is depicted as the difference between where the phase of voltage $v_{of}$ at 180 degrees where the phase of $v_{sf}$ is at 180 degrees.

B. Initialization of the Continuous Monitor.

A DC microgrid such as that shown in FIG. 1 is expected to be dynamic with sources and loads coming on and going off during normal operation of the system. This implies that, for the continuous monitor, $Z_{away}$ cannot be known a priori. However, the operation and controller design of the stability margin monitor depend on $Z_{away}$. Hence a measurement-based initialization of the continuous monitor is proposed herein based on the model simplification presented above.

Figure 8:
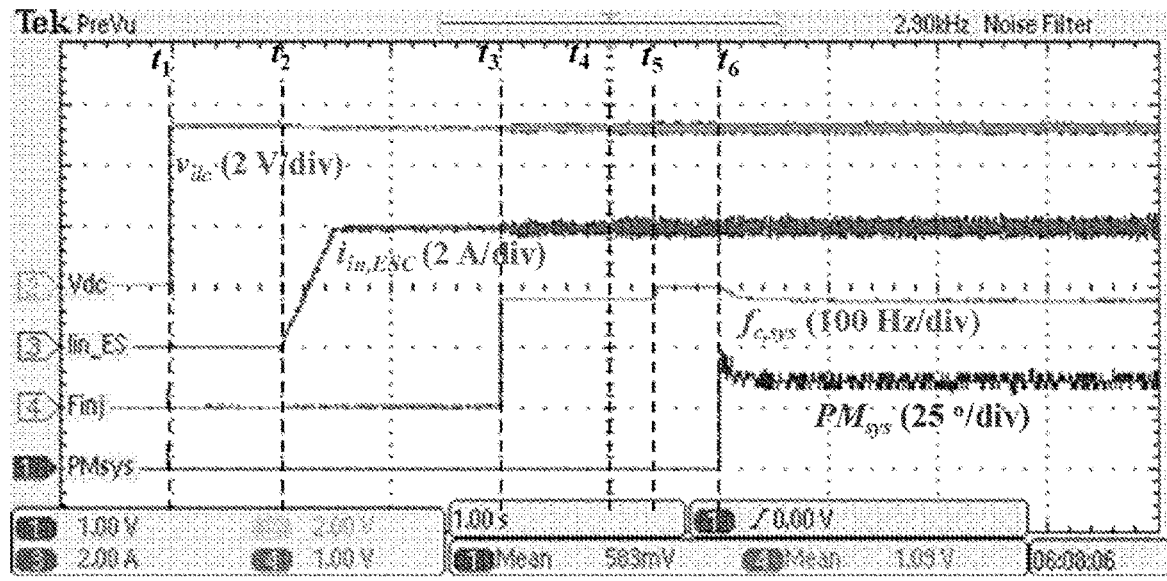
FIG. 8 is DC bus voltage, ESC current input from DC bus, system crossover frequency and system phase margin during initialization of the continuous monitor.

To better explain the initialization steps, the experimental results of the continuous monitor initialization for the hardware setup of FIG. 5 is shown in FIG. 8 where, from the top, the first trace shows the DC bus voltage $v_{dc}$, the second trace shows the current $i_{in,ESC}$ that the ESC draws from the bus, the third trace shows the identified system crossover frequency $f_{c,sys}$ and the last trace shows the identified system phase margin $PM_{sys}$. The initialization steps shown in FIG. 8 are as follows.

1) Time $t_1$: At time $t_1$, the source converter starts up, ramps up the DC link voltage and starts regulating it in closed loop.
2) Time $t_2$: At time $t_2$, the ESC starts up, enables closed loop regulation of the output current control and ramps up the current drawn from the DC link to 4 A.
3) Time $t_3$: At time $t_3$, the continuous monitor enables the injection of square wave perturbation. The frequency of injection, $f_{inj}$, is set to be the initial estimate of $f_{c,sys}$ (180 Hz) which can be estimated from a one-time frequency sweep or a wide-band injection. The amplitude of perturbation is ramped up from zero to an initial value computed from equation (26).
4) Time $t_4$: At time $t_4$, the DC gain of the amplitude loop is estimated from equation (27) by setting:

$$\|G_{plant,vo}(j\omega_{inj})\| = \frac{v_{ofp}}{A}, \quad (30)$$

where A is the value of the initial amplitude of injection. Then the integrator gain for the perturbation amplitude controller is computed using equation (29) and the integrator is enabled. From $t_4$ onwards, the perturbation amplitude is regulated to be 150 mV which is 3% of the rated DC bus voltage of 5 V.

5) Time $t_5$: At time $t_5$, the envelope error, $v_{env,err}$, is recorded for an $f_{inj}$ of 180 Hz and then $f_{inj}$ is ramped up to 200 Hz. 6) Time t6: At time t6, the envelope error, $v_{env,err}$, is recorded for $f_{inj}$ of 200 Hz. This value and the value at t5 are used in equation (24) to compute the DC gain of the $f_{inj}$ loop and then the $f_{inj}$ integrator gain is computed using equation (28). Finally, the $f_{inj}$ integrator and $PM_{sys}$ computation are enabled, after which, the ESC monitors fc,sys and $PM_{sys}$ continuously.

C. Performance of the Continuous Monitor

Once the continuous monitor has been initialized, the load converter power is ramped up to 30 watts ("W"), at which point $PM_{sys}$ is low (~20°). Then, the load power is ramped down to 0 W at a rate of 5 watts per second ("W/s"). The response of the system and the monitor outputs (fc,sys and $PM_{sys}$) for this transient are shown in FIG. 9 where, from the top, the first trace shows the DC bus voltage $v_{dc}$, the second trace shows the load converter input current $i_{in,Load}$, the third trace shows the identified system crossover frequency $f_{c,sys}$ and the last trace shows the identified system phase margin $PM_{sys}$.

Figure 9:
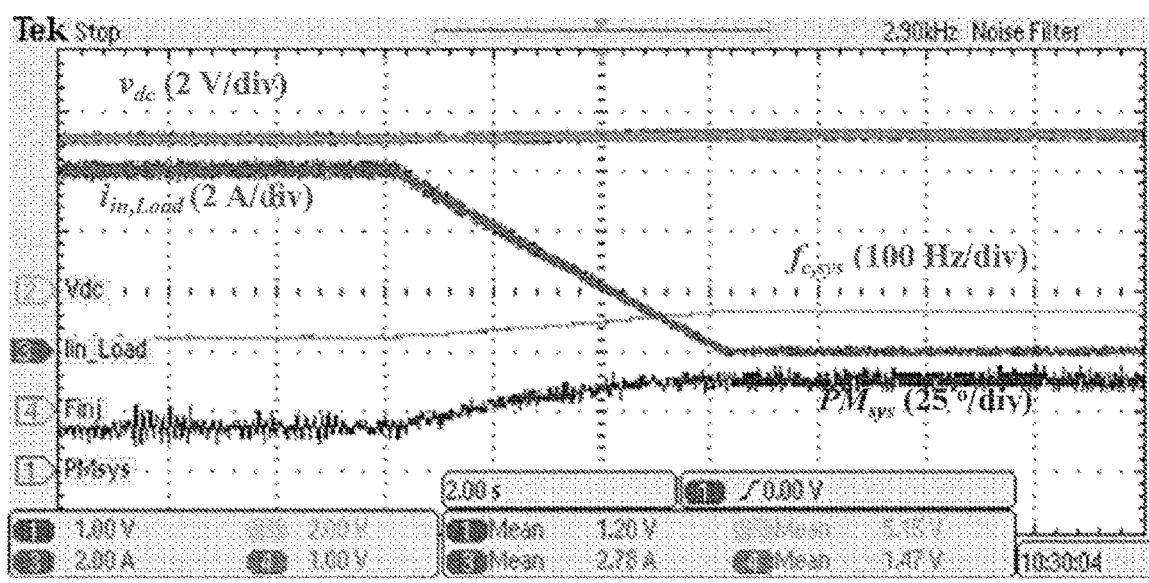
FIG. 9 is DC bus voltage, load converter input current, system crossover frequency and system phase margin during load transient.
Figure 10:
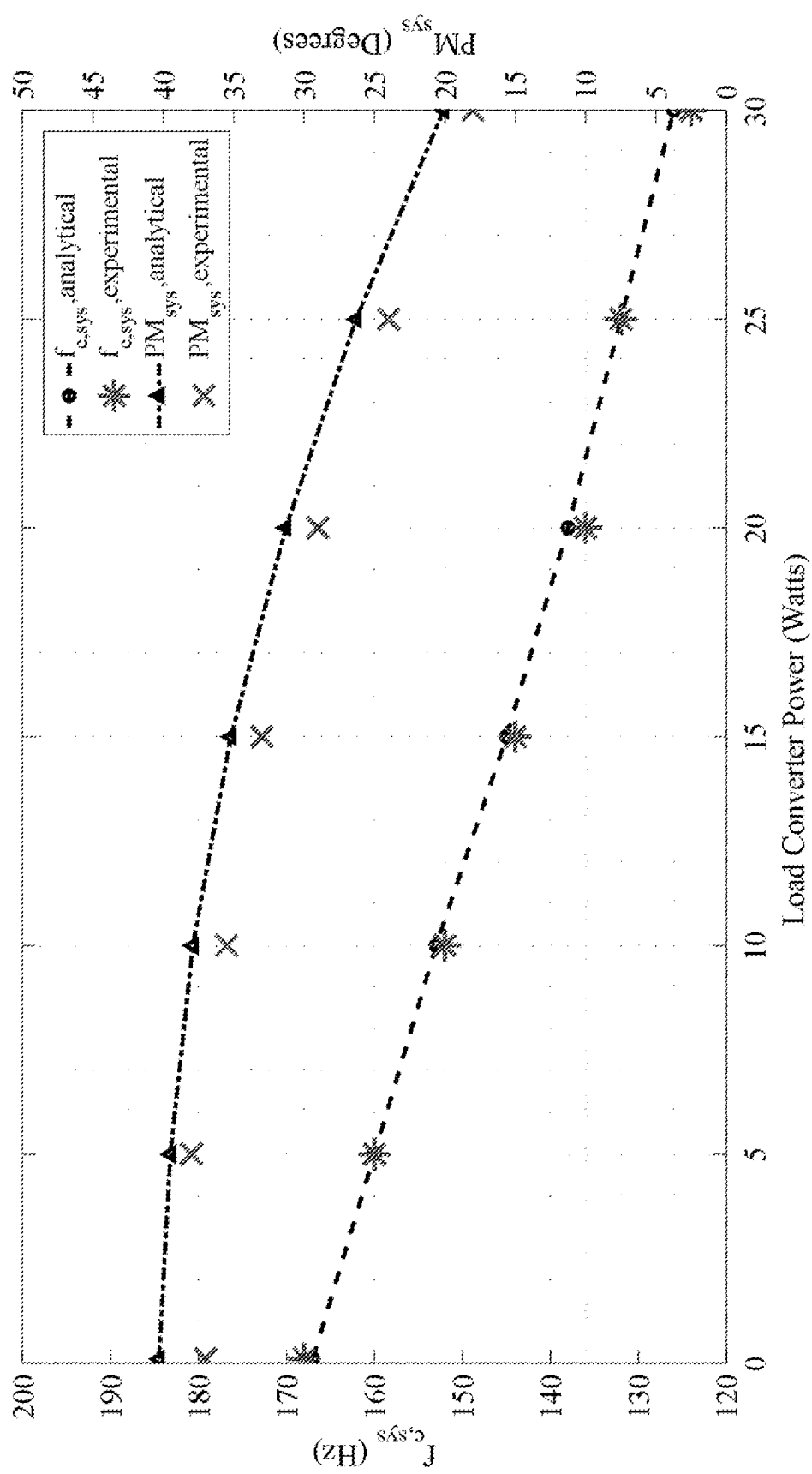
FIG. 10 is a comparison of the experimental performance of the continuous monitor with theoretical analysis results.

From the $v_{dc}$ trace in FIG. 9, it is evident that the amplitude of perturbation is regulated before, during and after the load transient. As the load power reduced from 30 W to 0 W, the identified $f_{c,sys}$ changed from 124 Hz to 168 Hz and the identified $PM_{sys}$ changed from 18° to 37°. To compare the performance of the monitor with the analytical models, the identified $f_{c,sys}$ and $PM_{sys}$ were recorded for load powers from 0 W to 30 W and plotted against theoretical values found using the Nyquist plots of FIG. 7B. The comparison is shown in FIG. 10, where the left y-axis shows frequency in Hz and the right y-axis shows the phase margin in degrees. FIG. 10 shows that the continuous monitor was able to identify $f_{c,sys}$ and $PM_{sys}$ with reasonable accuracy.

A novel method to monitor the system stability margin of a DC microgrid online in a continuous fashion has been proposed herein. The continuous monitoring technique can be embedded into any one of the converters already present in the system to evaluate the system stability margin without much additional computational cost. The proposed small-signal analysis of the continuous monitor and simplification method allow the online measurement-based design and tuning of the monitor controllers, with an estimated system crossover frequency to start. To validate the proposed analysis and design, hardware results are provided for the auto-initialization and operation of the proposed continuous monitor and compared with the theoretical prediction over a range of operating conditions. The continuous monitor proposed herein is applicable to other systems with multiple sources, loads and bidirectional converters connected. The monitored system crossover frequency and phase margin can be used in active stabilization, active damping and system central controller for system stabilization.

The proposed stability measurement system measures the system minor loop gain online and continuously by using a small perturbation in the system and measuring the terminal voltage and current. The proposed stability measurement system has potential to be applied in several applications such as electric and hybrid electric ships, including ships that have DC power distribution system, DC fast charging stations for charging of electric vehicles, and electric and hybrid electric aircraft having regulated DC power distribution system.

The usage of this invention would be to enable the customers to continuously monitor the system stability and make sure that the system operates reliably, is able to absorb disturbances, and take proactive measures to increase stability before the system reaches dangerously low margins.

Main aspects of the proposed stability measurement system:

A power converter connected to a DC microgrid that continuously measures the small-signal stability margin of the DC link as well as the critical frequency for small-signal stability;

The invention uses a small perturbation injected through its controller, senses the DC-terminal output current and DC-terminal voltage, and calculates the DC microgrid system minor loop gain;

The invention uses the system minor loop gain calculation to drive the injection frequency to the crossover frequency of the system minor loop gain, thereby evaluating the phase margin at the crossover frequency;

The invention limits the amplitude of the perturbation in the system by using the sensed DC-terminal voltage and controlling the amplitude of perturbation to regulate that voltage; and The proposed stability monitor can be incorporated into any power electronic converter topology in a DC microgrid if it has:

i. Sensing of the DC-terminal voltage and output current,
ii. A controller capable of influencing the DC link voltage and current,
iii. Known analytical model of the small-signal output impedance, and
iv. Computational capability to evaluate the required functions of the stability monitor.

Figure 4:
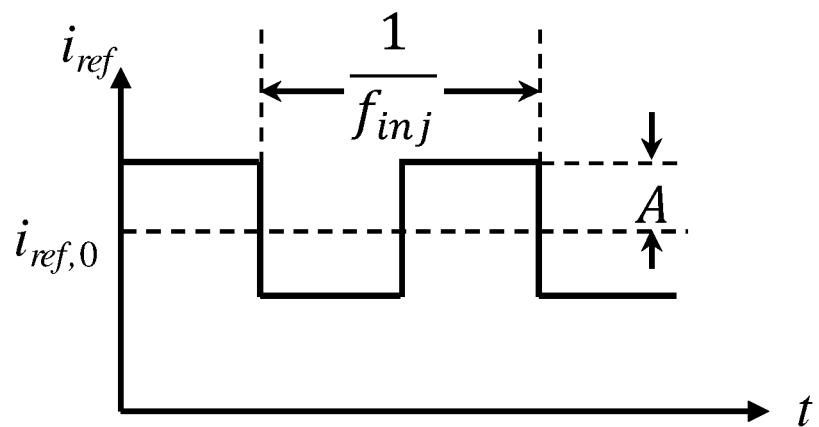
FIG. 4 is a schematic block diagram of one embodiment of a waveform of the current reference with square-wave perturbation.

In the block diagram of the proposed stability monitor shown in FIG. 3B, a converter connected to a DC microgrid has a controller that regulates output current $i_o$ (which could be a current or voltage associated with the converter) at a reference given by $i_{ref}$. A perturbation $i_{inj}$ is added on top of it that comprises a square wave with a frequency $f_{inj}$ and amplitude A, as shown in FIG. 4.

The injection $i_{inj}$ is added on top of a steady state reference $i_{ref0}$ to generate the reference ref that is the input of the controller. Through the controller and the converter power stage, the perturbation is injected into the terminal voltage $v_o$ and current $i_o$. The response of the system is measured by measuring $v_o$ and $i_o$ and using the bandpass filters tuned at the injection frequency, $f_{inj}$, the component of $v_o$ and $i_o$ at the injection frequency, $v_{of}$ and $i_{of}$ respectively, are evaluated. The filtered current $i_{of}$ is fed to an analytical closed-loop output impedance model of the converter, $Z_0(s)$, to evaluate its response to the perturbation, $v_{sf}$. An envelope detection algorithm is used in the 'Envelope Detector' block to determine the amplitude of $v_{of}$ and $v_{sf}$, denoted by $v_{ofp}$ and $v_{sfp}$ respectively. The amplitudes $v_{ofp}$ and $v_{sfp}$ are used by 'Envelope Error' block to generate an error $v_{env,err}$ for the controller '$f_{inj}$ Controller', which is used to bring the frequency $f_{inj}$ to a value where the minor loop gain equals 1. When the $f_{inj}$ controller reaches zero error, the injection frequency $f_{inj}$ is at the crossover frequency of the minor loop gain. Then, the 'Phase Calculation' block calculates the phase difference of $v_{of}$ and $v_{sf}$ which gives us the stability margin. Furthermore, the 'Amplitude Error' block compares the amplitude of the voltage perturbation $v_{ofp}$ to a reference $A_{ref}$ and generates an error for the 'Amplitude Controller' block that adjusts the injection amplitude A to regulate the amplitude of the voltage perturbation.

A Power Electronic Instrument for Active Stability Regulation of Interconnected Converters Based on Dynamic Virtual Impedance As stated above, DC microgrid comprises of several power electronic converters that are interconnected and share a DC link, as depicted in FIG. 1. The individual converters in a DC microgrid may serve various purposes such as sourcing power, drawing power or providing energy storage backup for the DC link, etc. The converters may also have various isolated or non-isolated topologies, with varying control actions implemented into each converter. All the above results in the converters having different behavior as seen from the DC link, and thus, for stable operation of the DC microgrid, their compatibility needs to be ensured. One method of ensuring compatibility is by evaluating the impedances of the inter-connected converters and ensuring that they satisfy the impedance-based stability criteria, as discussed above. FIG. 2 shows a representation of a DC microgrid where each connected converter is represented by its small-signal Thevenin equivalent. The stability of the DC microgrid is evaluated by evaluating the system minor loop gain given by:

$$\text{Minor loop gain} = \frac{Z_o}{Z_{away}}, \tag{31}$$

where $Z_o$ is the output impedance of one of the converters in the DC microgrid and $Z_{away}$ is the combined impedance of the rest of the system. The system crossover frequency is defined as the frequency at which the magnitude of the minor loop gain is 1. The phase of the minor loop gain at the crossover frequency gives information about the stability margin (phase margin) of the DC microgrid, as discussed above.

For systems in which cost, weight and/or volume prohibit system overdesign to ensure stability, active stability enhancement methods are employed. Of the many methods proposed in literature for stability enhancement, virtual impedance based methods modify the impedance of a converter to bring the phase of the minor loop gain closer to zero. Several implementations of virtual impedance have been discussed in literature, but all have drawbacks.

Figure 11:
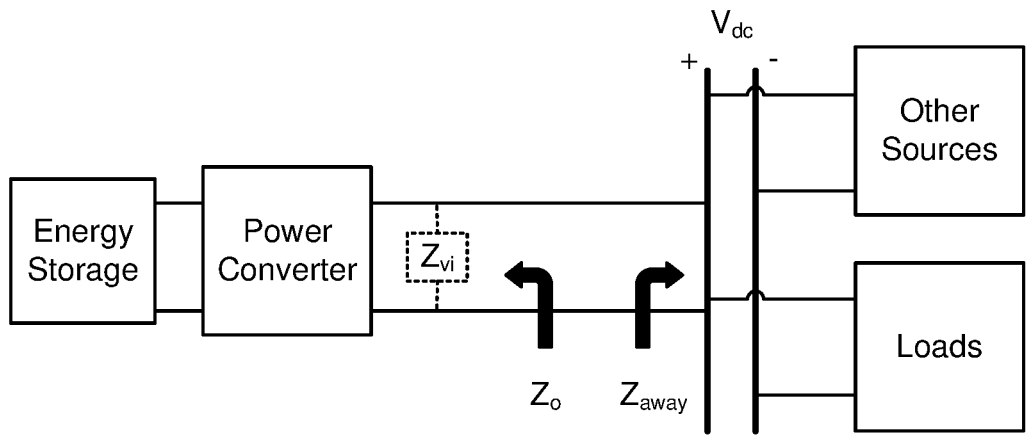
FIG. 11 is a schematic block diagram of one embodiment of dynamic virtual impedance; (a) concept and (b) a Bode plot of an implementation example indicating how parameters affect the dynamic virtual impedance.
Figure 11:
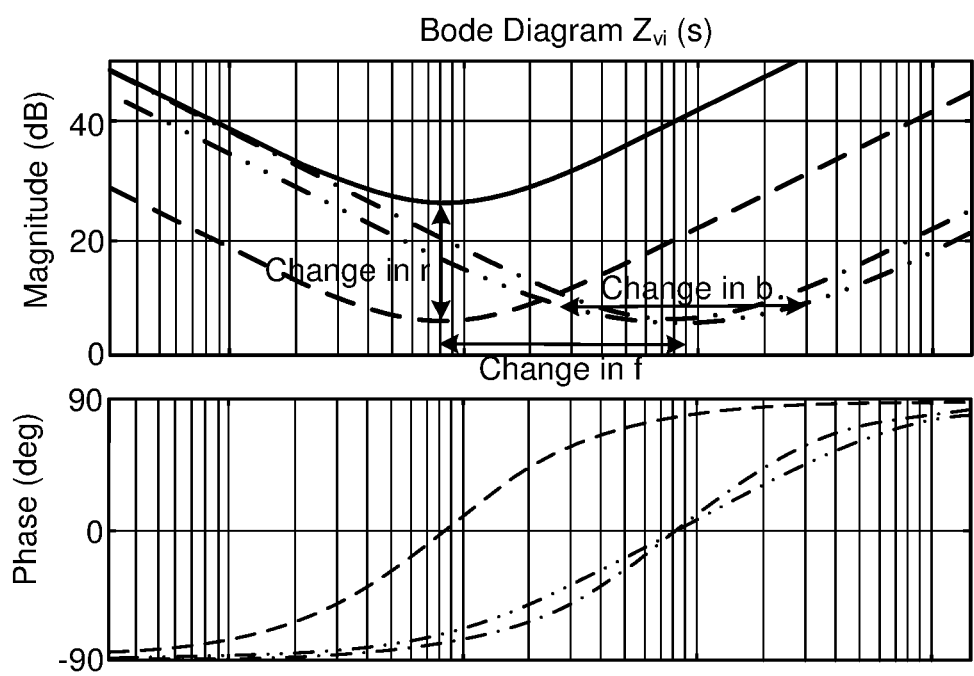

The embodiments below propose a power electronic apparatus that can regulate the stability of a DC microgrid system by emulating a dynamic virtual impedance ("DVI"), which is defined as a second order system emulating a series RLC branch connected in parallel to the converter output as shown in FIG. 11(a). FIG. 11(b) shows an example implementation of DVI and shows its dependence on the parameters, where the impedance $Z_{vi}(s)$ is defined by the following equation.

$$\frac{1}{z_{vi}(s)} = \frac{s\frac{(2\pi f)\sqrt{b}}{r}}{s^2 + s(2\pi f)\sqrt{b} + (2\pi f)^2}, \tag{32}$$

In the above equation 'f', 'b' and 'r' are defined as the center frequency, bandwidth and resistance value respectively, and are input parameters to the DVI. The DVI can be implemented into a power converter as shown in FIG. 12.

Figure 12:
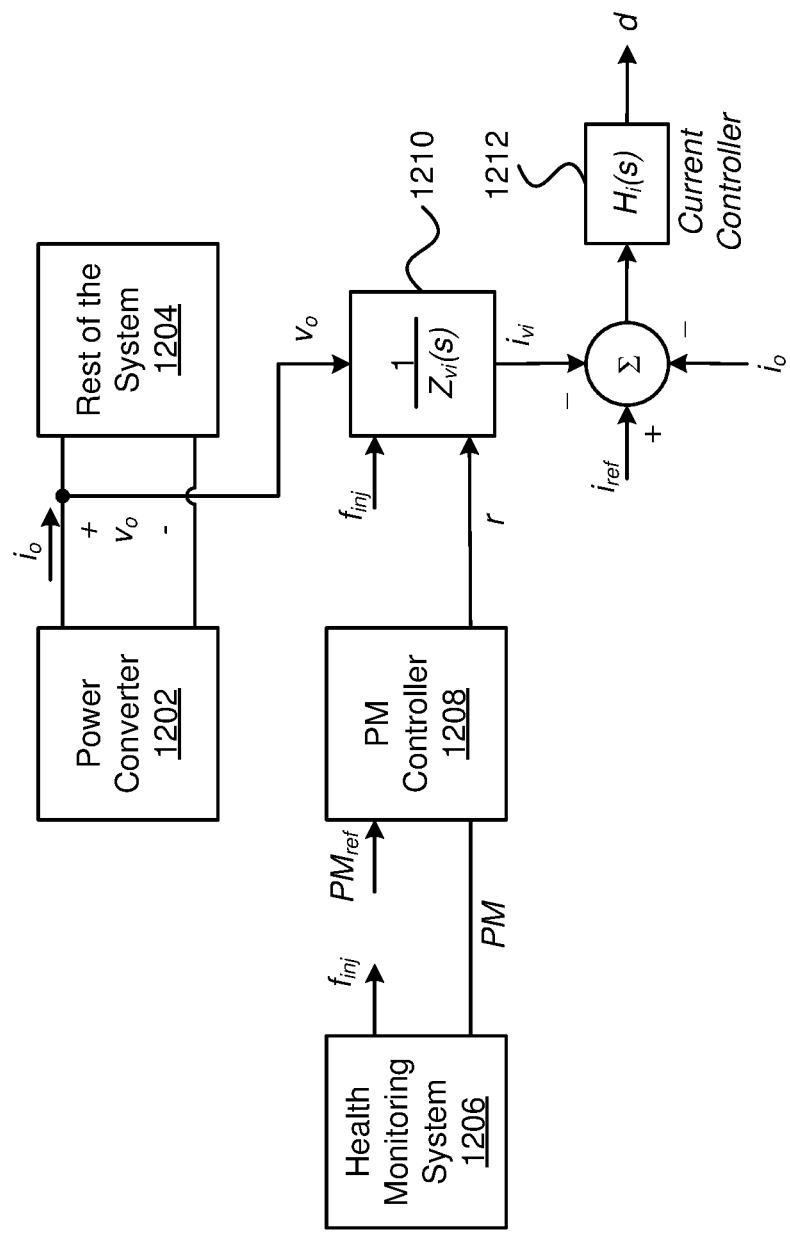
FIG. 12 is a schematic block diagram of one embodiment of dynamic virtual impedance ("DVI").

As shown in FIG. 12, DVI is implemented as a transfer function from the output voltage, $v_o$, to a small contribution into the reference of the current controller, $i_{vi}$. The value of $f_{inj}$ can come from any health monitoring system that can provide the critical frequency of the system at which resonance is suspected (or the frequency where the magnitude of the system minor loop gain is equal to 1). In some embodiments, the health monitoring system is any of the monitoring loops of FIGS. 3A, 3B and 3C, as described above.

Changes in $f_{inj}$ move the frequency response of DVI horizontally, as shown in FIG. 11(b). The parameter r defines the magnitude of DVI at the critical frequency, which comes from the output of a phase margin (PM) regulator that takes in input from a health monitoring system which monitors the system stability margin. Changes in r move the frequency response vertically, as shown in FIG. 11(b). The parameter b defines the width of the frequency response over which the DVI behaves resistive. A value of 10 for b results in the resistive behavior spanning 1 decade centered around $f_{inj}$, a value of 100 for b results in the resistive behavior spanning 2 decades centered around $f_{inj}$, and so on. For values of b lower than 1, $Z_{vi}$ will behave like a notch filter with a magnitude of r at the notch frequency $f_{inj}$.

The power converter 1202, in some embodiments, is a switching power converter as described above and depicted in FIGS. 2, 3A, 3B, and 11(a). The rest of the system 1204 is also as described above and illustrated in FIGS. 2, 3A, 3B, and 11(a). The health monitoring system 1206 is also as described above and depicted in FIGS. 3A, 3B and 3C and elsewhere. In some embodiments, the phase margin ("PM") controller 1208, in some embodiments, is implemented with a summation block that determines an error between the system phase margin PM$_{sys}$ and the phase margin reference PM$_{ref}$ and integrated or compensated in some other way by a PI controller, a PID controller, etc. to produce parameter r. The DVI impedance 1210, in some embodiments, is implemented as equation (32) with inputs of the minor loop gain crossover frequency f$_{inj}$, the parameter r and the monitored voltage of the DC bus.

In some embodiments, the PM controller 1208 and DVI impedance 1210 form a DVI injector configured to inject a DVI signal i$_{vi}$ onto a control loop of the power converter 1202 based on the voltage of the DC bus v$_o$ or the current to the DC bus i$_o$. In the embodiment depicted in FIG. 12, the control loop is a current loop and the DVI injector is configured to so the DVI signal i$_{vi}$ is injected in the current loop. The DVI injector has inputs of the current to the DC bus i$_o$, the system minor loop gain crossover frequency f$_{inj}$ and a stability margin error signal r. The stability margin error includes a difference between the DC power system stability margin PM$_{sys}$ and a stability margin reference PM$_{ref}$, but also may be multiplied by a compensation factor, such as a PI control term, a PID control term, etc. The DVI signal emulates an impedance in series or parallel to an output of the switching power converter 1202. In the embodiment depicted, the DVI signal emulates an impedance in parallel with the output of the switching power converter 1202, as depicted in FIG. 11(a). In some embodiments the DVI impedance is formulated to be in series with the switching power converter 1202 for a voltage control loop.

In some embodiments, the DVI impedance transforms the analytic expression in equation (32) is transformed using a bilinear transform, for example the Tustin bilinear transform, to convert the DVI impedance into a discrete transfer function. The discrete transfer function, in some embodiments, is implemented using a micro controller or a field-programmable gate array ("FPGA"). In other embodiments, the DVI impedance is implemented using hardware circuits or other method known to those of skill in the art.

In some embodiments, the DVI impedance 1210 includes a stability tuning circuit configured to continuously tune a center frequency, an amplitude at the center frequency and/or a width of an impedance flat region of the emulated impedance. In other embodiments, the stability tuning circuit continuously tunes the center frequency in response to changes to the system minor loop gain crossover frequency f$_{inj}$ and the stability tuning circuit continuously tunes the amplitude at the center frequency in response to the stability margin error r.

While the DVI injector injects a DVI signal i$_{vi}$ into the current control loop of FIG. 12, which controls output current of the switching power converter 1202, in other embodiments the DVI injector injects the DVI signal in another location. For example, the DVI injector may inject a DVI signal into an input current control loop. In the embodiment, the effect of the DVI impedance 1210 would be scaled by the conversion ratio of the switching power converter 1202. One of skill in the art will recognize other ways that the DVI impedance 1210 may be injected into the switching power converter 1202.

This invention has potential to be applied in several applications such as: Electric and hybrid electric ships, including ships that have DC power distribution system, DC fast charging stations for charging of electric vehicles, and Electric and hybrid electric aircraft having regulated DC power distribution system. The usage of the embodiments described herein would be to enable the customers to enhance system stability using control, allowing them to avoid system overdesign, reduce the required size of the passive filters in the system and reduce system cost and volume. Furthermore, this will allow customers to make sure that the system operates reliably and is able to absorb disturbances.

Some of the main aspects of the embodiments described herein include:

a. A power electronic apparatus that regulates the stability margin of the system by emulating a dynamic virtual impedance on the DC bus;

b. The invention emulates a virtual impedance on the bus in a way that decouples the tuning parameters of the impedance (center frequency, magnitude, resistance width) so that they can be part of independent feedback loops;

c. The invention uses system health information (stability margin and crossover frequency), that can come from any health monitoring system, and explicitly regulates the system stability margin to the desired value by continuously adjusting the DVI, allowing for a wide range of system operating conditions; and d. The proposed stability regulator can be incorporated into any power electronic converter topology in a DC microgrid if it has:

i. Sensing of the DC-terminal voltage and output current, ii. A controller with a bandwidth capable of influencing the DC link voltage and current, iii. A health monitoring system that provides the system minor loop gain crossover frequency and stability margin iv. Computational capability to evaluate the required functions of the stability regulator.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a switching power converter comprising a control loop, the switching power converter connected to a direct current ("DC") bus of a DC power system; and
   a monitoring loop injected into the control loop, the monitoring loop comprising:
   a sensor circuit configured to monitor voltage of the DC bus and current to the DC bus;
   a small signal injector configured to produce a periodic signal comprising a variable amplitude and a variable frequency and to inject the periodic signal on a reference signal of the control loop;
   a stability measurement circuit configured to vary a frequency input to the small signal injector until a fundamental component of the periodic signal has a frequency equal to a system minor loop gain crossover frequency of an impedance ratio of a converter closed loop output impedance and an impedance of the DC power system, the impedance ratio based on the monitored voltage and current; and
   a measurement output circuit configured to output a DC power system stability margin at the system minor loop gain crossover frequency.

2. The apparatus of claim 1, wherein the monitored current to the DC bus equals output current from the switching power converter such that a ratio of the converter closed loop output impedance and the impedance of the DC power system is represented by a ratio of the monitored voltage of the DC bus and a DC power system voltage, wherein the stability measurement circuit derives the DC power system voltage by multiplying the monitored current to the DC bus by a model of an output impedance of the switching power converter.

3. The apparatus of claim 2, wherein the system minor loop gain crossover frequency occurs when the monitored voltage of the DC bus equals the DC power system voltage and the stability measurement circuit derives a crossover error signal based on a difference between the monitored voltage of the DC bus and the DC power system voltage, wherein the stability measurement circuit varies the frequency to the small signal injector until the fundamental component of the periodic signal has a frequency equal to the system minor loop gain crossover frequency by varying the frequency to the small signal injector based on the crossover error signal.

4. The apparatus of claim 3, wherein the measurement output circuit derives the DC power system stability margin as a difference between 180 degrees and a phase shift between the monitored voltage of the DC bus and the DC power system voltage.

5. The apparatus of claim 3, wherein the stability measurement circuit derives the crossover error signal based on a difference between a peak value of the monitored voltage of the DC bus and a peak value of the DC power system voltage.

6. The apparatus of claim 1, wherein the stability measurement circuit further comprises an amplitude monitoring circuit configured to maintain an amplitude of the monitoring loop at an amplitude reference value.

7. The apparatus of claim 6, wherein the small signal injector varies the amplitude of the periodic signal in response to an amplitude error signal from the amplitude monitoring circuit and the amplitude monitoring circuit varies the amplitude error signal as a function of the amplitude reference value and the monitored voltage of the DC bus.

8. The apparatus of claim 1, wherein the periodic signal comprises one of a sinusoidal waveform and a square waveform.

9. The apparatus of claim 1, wherein the stability measurement circuit comprises a voltage bandpass filter configured to output the monitored voltage of the DC bus at the system minor loop gain crossover frequency and a current bandpass filter configured to output the monitored current to the DC bus at the system minor loop gain crossover frequency.

10. An apparatus comprising:
a switching power converter with a control loop, the switching power converter connected to a direct current ("DC") bus of a DC power system; and
a dynamic virtual impedance ("DVI") loop injected into the control loop, the DVI loop comprising:
a sensor circuit configured to monitor voltage of the DC bus and current to the DC bus;
a stability margin monitoring circuit configured to output a DC power system stability margin at a system minor loop gain crossover frequency; and
a DVI signal injector configured to inject a DVI signal onto the control loop based on the voltage of the DC bus or the current to the DC bus, the system minor loop gain crossover frequency and a stability margin error signal, the stability margin error signal comprising a difference between the DC power system stability margin and a stability margin reference, wherein the DVI signal emulates an impedance in parallel or series to an output of the switching power converter.

11. The apparatus of claim 10, further comprising a stability tuning circuit configured to continuously tune a center frequency, an amplitude at the center frequency and/or a width of an impedance flat region of the emulated impedance.

12. The apparatus of claim 11, wherein the stability tuning circuit continuously tunes the center frequency in response to changes to the system minor loop gain crossover frequency and wherein the stability tuning circuit continuously tunes the amplitude at the center frequency in response to the stability margin error signal.

13. The apparatus of claim 10, wherein the stability margin monitoring circuit comprises:
a small signal injector configured to produce a periodic signal comprising a variable amplitude and a variable frequency and to inject the periodic signal on a reference signal of the control loop; and
a stability measurement circuit configured to vary a frequency input to the small signal injector until a fundamental component of the periodic signal has a frequency equal to the system minor loop gain crossover frequency of an impedance ratio of a converter closed loop output impedance and an impedance of the DC power system, the impedance ratio based on the monitored voltage and current.

14. The apparatus of claim 13, wherein the monitored current to the DC bus equals output current from the switching power converter such that a ratio of the converter closed loop output impedance and the impedance of the DC power system is represented by a ratio of the monitored voltage of the DC bus and a DC power system voltage, wherein the stability measurement circuit derives the DC power system voltage by multiplying the monitored current to the DC bus by a model of an output impedance of the switching power converter.

15. The apparatus of claim 14, wherein the system minor loop gain crossover frequency occurs when the monitored voltage of the DC bus equals the DC power system voltage and the stability measurement circuit derives a crossover error signal based on a difference between the monitored voltage of the DC bus and the DC power system voltage, wherein the stability measurement circuit varies the frequency to the small signal injector until the fundamental component of the periodic signal has a frequency equal to the system minor loop gain crossover frequency by varying the frequency to the small signal injector based on the crossover error signal.

16. The apparatus of claim 10, wherein the impedance emulated by the DVI signal comprises an inductance-resistance-capacitance circuit with a center frequency at the system minor loop gain crossover frequency with a capacitance characteristic at low frequency and an inductance characteristic at high frequency and wherein the center frequency is a resonant frequency of the inductance and capacitance.

17. The apparatus of claim 10, wherein the control loop is a current control loop and wherein the DVI signal is a current injection signal derived by multiplying the monitored voltage of the DC bus by a reciprocal of a DVI impedance defined as:

$$\frac{1}{Z_{vi}(s)} = \frac{s\frac{(2\pi f)\sqrt{b}}{r}}{s^2 + s(2\pi f)\sqrt{b} + (2\pi f)^2}$$

wherein:

r is the control output emulating virtual resistance, f is the system minor loop gain crossover frequency, b is a parameter to modify the frequency response of DVI, s is a LaPlace variable, and $Z_{vi}(s)$ is the DVI impedance.

18. An apparatus comprising:
a switching power converter comprising a control loop, the switching power converter connected to a direct current ("DC") bus of a DC power system; and
a monitoring loop injected into the control loop, the monitoring loop comprising:
   a sensor circuit configured to monitor voltage of the DC bus and current to the DC bus;
   a small signal injector configured to produce a periodic signal comprising a variable amplitude and a variable frequency and to inject the periodic signal on a reference signal of the control loop;
   a stability measurement circuit configured to vary a frequency input to the small signal injector until a fundamental component of the periodic signal has a frequency equal to a system minor loop gain crossover frequency of an impedance ratio of a converter closed loop output impedance and an impedance of the DC power system represented by a ratio of the monitored voltage of the DC bus and a DC power system voltage, the DC power system voltage comprising a product of the monitored current to the DC bus and a model of an output impedance of the switching power converter, and
   wherein the stability measurement circuit derives a crossover error signal based on a difference between the monitored voltage of the DC bus and the DC power system voltage and the stability measurement circuit varies the frequency to the small signal injector until the fundamental component of the periodic signal has a frequency equal to the system minor loop gain crossover frequency by varying the frequency to the small signal injector based on the crossover error signal; and
   a measurement output circuit configured to output a DC power system stability margin at the system minor loop gain crossover frequency.

19. The apparatus of claim 18, further comprising a DVI signal injector configured to inject a DVI signal onto the control loop based on the voltage of the DC bus or the current to the DC bus, the system minor loop gain crossover frequency and a stability margin error signal, the stability margin error signal comprising a difference between the DC power system stability margin and a stability margin reference, wherein the DVI signal emulates an impedance in series or parallel to an output of the switching power converter.

20. The apparatus of 19, further comprising a stability tuning circuit configured to continuously tune a center frequency, an amplitude at the center frequency and/or a width of an impedance flat region of the emulated impedance, wherein the stability tuning circuit continuously tunes the center frequency in response to changes to the system minor loop gain crossover frequency and wherein the stability tuning circuit continuously tunes the amplitude at the center frequency in response to the stability margin error.

\* \* \* \* \*